(12) United States Patent
Mikawa et al.

(10) Patent No.: US 8,344,345 B2
(45) Date of Patent: Jan. 1, 2013

(54) NONVOLATILE SEMICONDUCTOR MEMORY DEVICE HAVING A RESISTANCE VARIABLE LAYER AND MANUFACTURING METHOD THEREOF

(75) Inventors: Takumi Mikawa, Shiga (JP); Yoshio Kawashima, Osaka (JP); Ryoko Miyanaga, Nara (JP)

(73) Assignee: Panasonic Corporation, Osaka (JP)

( * ) Notice: Subject to any disclaimer, the term of this patent is extended or adjusted under 35 U.S.C. 154(b) by 287 days.

(21) Appl. No.: 12/810,667

(22) PCT Filed: Dec. 26, 2008

(86) PCT No.: PCT/JP2008/004021
§ 371 (c)(1),
(2), (4) Date: Jun. 25, 2010

(87) PCT Pub. No.: WO2009/081595
PCT Pub. Date: Jul. 2, 2009

(65) Prior Publication Data
US 2010/0283026 A1    Nov. 11, 2010

(30) Foreign Application Priority Data
Dec. 26, 2007   (JP) ................................ 2007-333768

(51) Int. Cl.
*H01L 29/02*   (2006.01)
(52) U.S. Cl. .. 257/2; 257/3; 257/4; 257/5; 257/E29.002; 438/102; 438/103

(58) Field of Classification Search ................... 257/2–5, 257/E29.002; 438/102–104; 20/2–5, E29.002
See application file for complete search history.

(56) References Cited

U.S. PATENT DOCUMENTS

| | | | |
|---|---|---|---|
| 6,731,535 B1 | 5/2004 | Ooishi et al. | |
| 6,753,561 B1 | 6/2004 | Rinerson et al. | |
| 2005/0013089 A1 | 1/2005 | Fukada | |
| 2005/0073010 A1* | 4/2005 | Lai et al. | 257/368 |
| 2005/0135146 A1 | 6/2005 | Taussig et al. | |
| 2007/0132049 A1 | 6/2007 | Stipe | |

FOREIGN PATENT DOCUMENTS

| | | |
|---|---|---|
| JP | 2004-193282 | 7/2004 |
| JP | 2004-356313 | 12/2004 |
| JP | 2004-363124 | 12/2004 |
| JP | 2005-182986 | 7/2005 |
| JP | 2005-317787 | 11/2005 |
| JP | 2006-203098 | 8/2006 |
| JP | 2007-165873 | 6/2007 |
| JP | 2007-287903 | 11/2007 |

\* cited by examiner

*Primary Examiner* — Jami M Valentine
(74) *Attorney, Agent, or Firm* — McDermott Will & Emery LLP

(57) ABSTRACT

A first wire layer (19) including first memory wires (12) is connected to a second wire layer (20) including second memory wires (17) via first contacts (21) penetrating a first interlayer insulating layer (13). The first wire layer (13) is connected to and led out to upper wires (22) via second contacts (26) connected to the second wire layer (20) and penetrating the second interlayer insulating layer (18). The first contacts (21) penetrate semiconductor layer (17*b*) or insulator layer (17*c*) of the second wire layer (20).

12 Claims, 14 Drawing Sheets

NONVOLATILE SEMICONDUCTOR MEMORY DEVICE HAVING A RESISTANCE VARIABLE LAYER AND MANUFACTURING METHOD THEREOF

TECHNICAL FIELD

The present invention relates to a cross-point nonvolatile semiconductor memory device using a resistance variable layer. Particularly, the present invention relates to a structure of a lead-out contact in a configuration in which a diode is integrated into a wire layer.

BACKGROUND ART

In recent years, with advancement of digital technologies of electronic hardware, semiconductor memory devices which have a large capacity and are nonvolatile have been developed vigorously to store data of music, image, information and so on. Among the nonvolatile semiconductor memory devices, for example, a nonvolatile semiconductor memory device using a ferroelectric as a capacitive element has been already used in many fields. In addition to the nonvolatile semiconductor memory device (hereinafter referred to as FeRAM) using such a ferroelectric capacitor, a nonvolatile semiconductor memory device (hereinafter referred to as MRAM) which retains a changed resistance value by utilizing a tunneling magnetic resistive effect, and a nonvolatile semiconductor memory device (hereinafter referred to as ReRAM) using a material which is adapted to change a resistance value in response to electric pulses applied and retains the changed resistance value, have attracted an attention. The MRAM and the ReRAM also have attracted an attention because of its high compatibility with a standard Si semiconductor process step.

In the nonvolatile semiconductor memory device, memory cell holes are typically formed at cross points where word lines cross bit lines, respectively, memory elements and cell select elements such as diodes which are connected in series with the memory elements are arranged inside the memory cell holes, respectively, and memory cells each of which is composed of the memory element and the cell select element are integrated in matrix. In addition, a peripheral circuit is provided adjacently to the memory cells arranged in matrix to drive the memory cells to process data from the memory cells, etc. Depending on a wiring structure of wires for connecting lead-out wires connected to memory cells to wires in the peripheral circuit, high-dense integration of the nonvolatile semiconductor memory device is impeded.

To solve this problem and implement a nonvolatile semiconductor memory device which is highly integrated, for example, a structure of a cross-point MRAM is proposed, in which memory cells each consisting of a TMR (tunneling magneto-resistive) element and a cell select diode which are connected in series are arranged in matrix (see e.g., patent document 1). Lead-out wires connected to memory cells are electrically connected to a peripheral circuit which is disposed above and adjacently to the memory cells.

As in the above MRAM, a structure of a cross-point FeRAM is proposed, in which lead-out wires connected to memory cells are led out to the upper side and electrically connected to an adjacent peripheral circuit (see e.g., patent document 2). Furthermore, it is proposed that, to reduce a chip area, localized wires are formed to connect a ferroelectric capacitor array region and a transistor formed right below the ferroelectric capacitor array region to a peripheral circuit, in the cross-point FeRAM (see e.g., patent document 3).

In an example of a cross-point ReRAM, memory plugs each of which has seven layers are formed at cross points between X-direction conductive array lines and Y-direction conductive array lines, and a memory element including a composite metal oxide sandwiched between two electrode layers, a non-ohmic element which is formed on the memory element and has a metal-insulator-metal (MIM) structure, and an electrode layer are stacked together inside each memory plug (e.g., see Patent Document 4). Electric connections or wires between the memory plug including the memory element and non-ohmic element, and a drive circuit such as a transistor or an adjacent peripheral circuit are not disclosed. It is presumed that these wires are formed in a process step performed separately.

Patent document 1: Japanese Laid-Open Patent Application Publication No. 2004-193282
Patent document 2: Japanese Laid-Open Patent Application Publication No. 2004-363124
Patent document 3: Japanese Laid-Open Patent Application Publication No. 2004-356313
Patent document 4: U.S. Pat. No. 6,753,561 Specification

DISCLOSURE OF THE INVENTION

Problems to be Solved by the Invention

However, in the above described prior arts, in a structure in which a conductive layer and a semiconductor layer or an insulator layer are stacked together and inserted into a wire of a cross-point memory section, electric connection to a underlying wire layer is difficult, because the semiconductor layer or the insulator layer is not conductive. For this reason, it is necessary to remove a portion of the semiconductor layer or the insulator layer where a contact connected to the underlying wire layer is to be formed, which inevitably increases necessary masks and process steps. In view of the above, it is difficult to form lead-out wires (hereinafter referred to as lead-out contacts) which can achieve both of high-dense integration and a low cost.

In a case where the semiconductor layer or the insulator layer is integrated into a wire in a peripheral circuit adjacent to the cross-point memory section, concurrently with the process steps for forming the cross-point memory section, in many cases, it is difficult to form lead-out contacts for interconnecting constituents of a nonvolatile semiconductor memory device, and there is a need for process steps for forming wires for the lead-out contacts. As a result, it is difficult to reduce the process cost due to, for example, an increase in the number of masks and process steps, in the process for manufacturing the nonvolatile semiconductor memory device.

The present invention has been developed to solve the above described problems, and an object of the present invention is to provide a nonvolatile semiconductor memory device which is capable of ensuring a sufficient current supply capability and of achieving lead-out contacts for wires in a cross-point memory section and lead-out contacts for wires in a peripheral circuit adjacent to the cross-point memory section without making process steps complicated or increasing a process cost, in a simplified manner and at a low cost, in the cross-point memory section including memory cells each having a basic structure consisting of a non-ohmic element such as a diode element and a resistance variable element.

Means for Solving the Problem

To achieve the above described object, a nonvolatile semiconductor memory device of the present invention comprises a substrate; a first wire layer including first memory wires formed on the substrate to have a stripe shape; a first interlayer insulating layer formed over the substrate and the first wire layer; first memory cell holes which are formed in the first interlayer insulating layer on the first memory wires; first resistance variable layers which are connected to the first memory wires via the first memory cell holes, respectively; first non-ohmic elements formed on the first resistance variable layers, respectively; second memory wires of a stripe shape which are formed on the first interlayer insulating layer such that the second memory wires cross the first memory wires perpendicularly to the first memory wires, respectively; a second wire layer including the second memory wires; and a second interlayer insulating layer formed over the second wire layer and the first interlayer insulating layer; wherein the second wire layer includes a plurality of layers including at least a portion of each of the first non-ohmic elements and has a semiconductor layer or an insulator layer in a lowermost layer of the second wire layer; and each of the first memory wires is connected to a desired portion of the second wire layer via a first contact penetrating the first interlayer insulating layer, and the first contact is formed by removing a portion of the semiconductor layer or insulator layer of the second wire layer.

In such a configuration, even when the semiconductor layer or the insulator layer is incorporated into the wire in the cross-point memory section, the first wire layer and the second wire layer can be connected to each other via the first contact with a shortest distance such that other layer for connecting these wire layers does not intervene between these wire layers. In addition, a wire for leading out the first wire or the second wire to an upper wire can be formed easily with a shortest distance. This makes it possible to reduce a parasitic resistance of the wires and achieve a high-speed memory operation.

In addition to the above, in a configuration of a memory cell having a combination of a non-ohmic element such as a diode element and a resistance variable layer, since the size of the diode element can be set larger than the size of the resistance variable layer, for example, the diode element can have a current supply capability to flow a sufficient current through the resistance variable layer. This makes it possible to achieve a nonvolatile semiconductor memory device which does not operate incorrectly and has high reliability and high-dense integration.

The nonvolatile semiconductor memory device may further comprise a memory cell section including memory cells which are formed between the first memory wires and the second memory wires and are arranged in matrix, each of the memory cells including the first resistance variable layer and the first non-ohmic element which are electrically connected in series; and a peripheral circuit section adjacent to the memory cell section; and wires in the peripheral circuit section may be formed by at least either one of first peripheral circuit wires having a structure identical to a structure of the first memory wires in the memory cell section and second peripheral circuit wires having a structure identical to a structure of the second memory wires in the memory cell section; and wherein the first peripheral circuit wires may be connected to the second peripheral circuit wires via third contacts penetrating the first interlayer insulating layer, respectively, and each of the third contacts may be formed by removing a portion of the semiconductor layer or insulator layer of the second wire layer.

In such a configuration, the wires in the cross-point memory section and the wires in the peripheral circuit can be formed concurrently as the wire layer on the same flat plane, even when the semiconductor layer or the insulator layer is incorporated into the wires in the cross-point memory section and the wires in the peripheral circuit. The wires in the cross-point memory section and the wires in the peripheral circuit can be easily led out to the upper wires, respectively, with shortest distances. Therefore, it is possible to manufacture a nonvolatile semiconductor memory device without substantially increasing the masks and the process steps in number in the manufacturing process.

A nonvolatile semiconductor memory device of the present invention comprises a substrate; a first wire layer including first memory wires formed on the substrate to have a stripe shape; a first interlayer insulating layer formed over the substrate and the first wire layer; first memory cell holes which are formed in the first interlayer insulating layer on the first memory wires; first resistance variable layers which are connected to the first memory wires via the first memory cell holes, respectively; first non-ohmic elements formed on the first resistance variable layers, respectively; second memory wires of a stripe shape which are formed on the first interlayer insulating layer such that the second memory wires cross the first memory wires perpendicularly to the first memory wires, respectively; a second wire layer including the second memory wires; and a second interlayer insulating layer formed over the second wire layer and the first interlayer insulating layer; second memory cell holes penetrating the second interlayer insulating layer on the second memory wires; second resistance variable layers which are connected to the second memory wires via the second memory cell holes, respectively; second non-ohmic elements formed on the second resistance variable layers, respectively; third memory wires of a stripe shape which are formed on the second interlayer insulating layer such that the third memory wires cross the second memory wires perpendicularly to the second memory wires, respectively; and a third wire layer including the third memory wires; the second wire layer includes a plurality of layers including at least a portion of each of first non-ohmic elements and has a semiconductor layer or an insulator layer in a lowermost layer of the second wire layer; the third wire layer includes a plurality of layers including at least a portion of each of second non-ohmic elements and has a semiconductor layer or an insulator layer in a lowermost layer of the third wire layer; the first wire layer is connected to a desired portion of the second wire layer via first contacts penetrating the first interlayer insulating layer; the second wire layer is connected to a desired portion of the third wire layer via fifth contacts penetrating the second interlayer insulating layer; each of the first contacts may be formed by removing a portion of the semiconductor layer or insulator layer of the second wire layer; and each of the fifth contacts may be formed by removing a portion of the semiconductor layer or insulator layer of the third wire layer.

In such a configuration, even when the semiconductor layer or the insulator layer is incorporated into the wire in the cross-point memory section, the first wire layer, the second wire layer and the third wire layer can be connected to each other via the first contacts and fifth contacts with shortest distances such that other wire layers for connecting these wire layers do not intervene between these wire layers. In addition, a wire for leading out the first wire layer, the second wire layer, or the third wire layer to the upper wire can be formed easily with a shortest distance. This makes it possible to reduce a parasitic resistance of the wires and achieve a high-speed memory operation.

In addition to the above, in a configuration of a memory cell having a combination of a non-ohmic element such as a diode element and a resistance variable layer, since the size of the diode element can be set larger than the size of the resistance variable layer, for example, the diode element can have a current supply capability to flow a sufficient current through the resistance variable layer. This makes it possible to achieve a nonvolatile semiconductor memory device which does not operate incorrectly and has high reliability and high-dense integration.

The nonvolatile semiconductor memory device may further comprise a memory cell section including memory cells which are formed between the first memory wires and the second memory wires, and between the second memory wires and the third memory wires, and are arranged in matrix, each of the memory cells including the first resistance variable layer and the non-ohmic element, or the second resistance variable layer and the non-ohmic element which are electrically connected in series; and a peripheral circuit section adjacent to the memory cell section; wherein wires in the peripheral circuit section may be formed by at least either one of first peripheral circuit wires having a structure identical to a structure of the first memory wires in the memory cell section, second peripheral circuit wires having a structure identical to a structure of the second memory wires in the memory cell section, and third peripheral circuit wires having a structure identical to a structure of the third memory wires in the memory cell section; wherein the first peripheral circuit wires may be connected to the second peripheral circuit wires via third contacts penetrating the first interlayer insulating layer, respectively, wherein the second peripheral circuit wires may be connected to the third peripheral circuit wires via sixth contacts penetrating the second interlayer insulating layer, respectively; wherein each of the third contacts may be formed by removing a portion of a semiconductor layer or insulator layer of the second wire layer and each of the sixth contacts may be formed by removing a portion of a semiconductor layer or insulator layer of the third wire layer.

In such a configuration, the wires in the cross-point memory section and the wires in the peripheral circuit can be formed concurrently as the wire layer on the same flat plane, even when the semiconductor layer or the insulator layer is incorporated in multiple layers into the wires in the cross-point memory section and the wires in the peripheral circuit. The wires in the cross-point memory section and the wires in the peripheral circuit can be easily led out to the upper wires, respectively, with shortest distances. Therefore, it is possible to manufacture a nonvolatile semiconductor memory device without substantially increasing the masks and the process steps in number in the manufacturing process.

The nonvolatile semiconductor memory device may further comprise one or more constituent units being stacked together, each of the constituent units including the second interlayer insulating layer, the third interlayer insulating layer, the third wire layer, and the second resistance variable layers and second non-ohmic elements which are filled into the second memory cell holes, respectively; and wires in a peripheral circuit may be formed in a portion of at least one of the wire layers; each of the wires in the peripheral circuit may have a semiconductor layer or an insulator layer in a lowermost layer thereof; and a contact penetrating an interlayer insulating layer provided between wires in different peripheral circuits arranged at upper and lower sides and electrically connecting the wires in the peripheral circuits may be formed by removing a portion of the semiconductor layer or the insulator layer.

In such a configuration, the cross-point memory section and the peripheral circuit can be three-dimensionally connected to each other with a shortest distance and the wires in the cross-point memory section and in the peripheral circuit can be three-dimensionally connected to each other with a shortest distance. This makes it possible to achieve a nonvolatile semiconductor memory device which does not operate incorrectly and has high reliability and high-dense integration.

The first wire layer may be connected to at least one of transistors located in a layer underlying the first resistance variable layers and the first wire layer.

In such a configuration, wires of the transistors for driving the cross-point memory section and connection wires for these can be surely led out. In addition, in a configuration of a memory cell having a combination of a non-ohmic element such as a diode element and a resistance variable layer, since the size of the diode element can be set larger than the size of the resistance variable layer, for example, the diode element can have a current supply capability to flow a sufficient current through the resistance variable layer. As a result, it is possible to implement a nonvolatile semiconductor memory device capable of leading out the wires in the cross-point memory section and in the peripheral circuit without making the process steps complicated and without increasing a process cost.

Diode electrodes which are electrodes of the first non-ohmic elements in the second wire layer or electrodes of the second non-ohmic elements in the third wire layer are made of a material of contacting layers of the first contacts, the third contacts, the fifth contacts and the sixth contacts, which are arranged adjacently to the first interlayer insulating layer or the second interlayer insulating layer.

In such a configuration, since the diode elements and the contacting layers of the contacts are made of the same material, the process steps can be simplified. Therefore, it is possible to manufacture a nonvolatile semiconductor memory device with the masks and the process steps significantly reduced in number in the manufacturing process.

In the above configuration, each of the non-ohmic elements may be a MSM diode having a stacked structure of three layers which are a semiconductor layer and metal electrode layers provided on and under the semiconductor layer; and wherein the metal electrode layer closer to the resistance variable layer may be filled into each of the memory cell holes.

In such a configuration, it is possible to easily attain the non-ohmic element which has a bidirectionally large current supply capability in positive and negative voltage directions and has a characteristic with a less variation, even when the resistance variable layer is so-called a bipolar resistance variable layer which changes its retained resistance in response to positive or negative voltage applied.

In the above configuration, each of the non-ohmic elements may be a Schottky diode having a stacked structure of two layers which are a semiconductor layer and a metal electrode layer; and the metal electrode layer may be filled into each of the memory cell holes.

In such a configuration, since majority carriers are dominant in the diode, a current supply capability of the diode can be increased and a high-speed operation can be achieved. This configuration is suitable for so-called a unipolar resistance variable layer which changes a retained resistance value in response to voltages with the same polarity and different magnitudes.

In the above configuration, each of the non-ohmic elements may be a pn-junction diode having a stacked structure of two layers which are a p-type semiconductor layer and a n-type semiconductor layer; and the p-type semiconductor layer or the n-type semiconductor layer may be filled into each of the memory cell holes.

In such a configuration, although the current supply capability of the this diode is lower than that of the above mentioned diode because minority carriers are dominant in this diode, it is expected that an excess current is effectively prevented and electric power consumption is effectively reduced in this diode. This configuration is suitable for so-called a unipolar resistance variable layer which changes a retained resistance value in response to voltages with the same polarity and different magnitudes.

By using the above described diode elements, cross talk at the time of reading or writing can be further reduced by utilizing a current steering characteristic of the diode elements, and a circuit configuration therefore can be simplified.

In the above configuration, the first contact may penetrate the semiconductor layers or insulator layers of the second wire layer.

A method of manufacturing a nonvolatile semiconductor memory device, of the present invention comprises the steps of: forming first memory wires of a stripe shape on a substrate; forming a first interlayer insulating layer over the substrate provided with the first memory wires; forming first memory cell holes in predetermined positions of the first interlayer insulating layer on the first memory wires, respectively; filling first resistance variable layers into the first memory cell holes, respectively; filling at least one layer of a stacked structure constituting each of first non-ohmic elements into an upper portion of the first memory cell hole; forming a semiconductor layer or an insulator layer which becomes stacked structures constituting the first non-ohmic elements over the first interlayer insulating layer such that the semiconductor layer or the insulator layer covers the first memory cell holes; forming first contacts and third contacts on the first memory wires such that the first contacts and the third contacts penetrate the first interlayer insulating layer and the semiconductor layer or the insulator layer; and patterning semiconductor layers or insulator layers of the first non-ohmic elements to form a second wire layer over the first interlayer insulating layer such that the second wire layer covers at least portions of the first contacts.

In such a method, since the first wire layer and the second wire layer can be connected to each other with a shortest distance via the first contacts and the third contacts such that other wire layers for connecting these wire layers do not intervene between these wire layers, and the wires in the cross-point memory section and the wires in the peripheral circuit are formed concurrently as the wire layer on the same flat plane. In addition, in a configuration of a memory cell having a combination of a non-ohmic element such as a diode element and a resistance variable layer, since the size of the diode element can be set larger than the size of the resistance variable layer, for example, the diode element can have a current supply capability to flow a sufficient current through the resistance variable layer. This makes it possible to achieve a nonvolatile semiconductor memory device which does not operate incorrectly and has high reliability and high-dense integration. Further, since the standard Si semiconductor process steps adapted for miniaturization may be used, the number of masks and the process cost can be reduced, and the process steps can be simplified.

A method of manufacturing a nonvolatile semiconductor memory device, of the present invention comprises the steps of: forming first memory wires of a stripe shape on a substrate; forming a first interlayer insulating layer over the substrate provided with the first memory wires; forming first memory cell holes in predetermined positions of the first interlayer insulating layer on the first memory wires, respectively; filling first resistance variable layers into the first memory cell holes, respectively; filling at least one layer of a stacked structure constituting each of first non-ohmic elements into an upper portion of the first memory cell hole; forming a semiconductor layer or an insulator layer which becomes stacked structures constituting the first non-ohmic elements over the first interlayer insulating layer such that the semiconductor layer or the insulator layer covers the first memory cell holes; forming first contacts and third contacts on the first wires such that the first contacts and the third contacts penetrate the first interlayer insulating layer and the semiconductor layer or the insulator layer in the stacked structure; and patterning semiconductor layers and insulator layers of the first non-ohmic elements to form a second wire layer over the first interlayer insulating layer such that the second wire layer covers at least portions of the first contacts and at least portions of the third contacts; forming a second interlayer insulating layer over the first interlayer insulating layer such that the second interlayer insulating layer covers the second wire layer; forming second memory holes on the second memory wires such that the second memory cell holes penetrate the second interlayer insulating layer; filling second resistance variable layers into the second memory cell holes, respectively; filling at least one layer of a stacked structure constituting each of second non-ohmic elements into an upper portion of the second memory cell hole; forming a semiconductor layer or an insulator layer which becomes stacked structures constituting the second non-ohmic elements over the second interlayer insulating layer such that the semiconductor layer or the insulator layer covers the second memory cell holes; forming fifth contacts and sixth contacts on the second wires such that the fifth contacts and the sixth contacts penetrate the second interlayer insulating layer and the semiconductor layer or the insulator layer in the stacked structure; and patterning semiconductor layers and insulator layers of the second non-ohmic elements to form a third wire layer over the second interlayer insulating layer such that the third wire layer covers at least portions of the fifth contacts and at least portions of the sixth contacts.

In such a method, since the first wire, the second wire and the third wire can be connected to each other with shortest distances via the first contact, the third contact and the fifth contact with shortest distances, respectively. In addition, the wires in the cross-point memory section and the wires in the peripheral circuit are formed concurrently as the wire layer on the same flat plane. Further, in a configuration of a memory cell having a combination of a non-ohmic element such as a diode element and a resistance variable layer, since the size of the diode element can be set larger than the size of the resistance variable layer, for example, the diode element can have a current supply capability to flow a sufficient current through the resistance variable layer.

From the above, it is possible to achieve a nonvolatile semiconductor memory device which does not operate incorrectly and has high reliability and high-dense integration. Further, since the standard Si semiconductor process step adapted for miniaturization may be used, the number of masks and the process cost can be reduced, and the process step can be simplified.

These objects as well as other objects, features and advantages of the invention will become more apparent to those skilled in the art from the following description with reference to the accompanying drawings.

EFFECTS OF THE INVENTION

The nonvolatile semiconductor memory device of the present invention is capable of ensuring a sufficient current supply capability and of implementing lead-out contacts for wires in a cross-point memory section and lead-out contacts for wires in peripheral circuit adjacent to the cross-point memory section without making process steps complicated and without increasing a process cost, in the cross-point memory section including memory cells each having a basic configuration having a combination of a non-ohmic element such as a diode element and a resistance variable element.

Furthermore, in a configuration of memory cells each having a combination of a non-ohmic element such as a diode element and a resistance variable layer, the diode element can have a current supply capability to flow a sufficient current through the resistance variable layer. In addition, the wires in the cross-point memory section and the wires in the peripheral circuit can be formed concurrently as the wire layer on the same flat plane. Therefore, the cross-point memory section and the peripheral circuit can be three-dimensionally connected to each other with a shortest distance and the wires in the cross-point memory section and in the peripheral circuit can be three-dimensionally connected to each other with a shortest distance. The process steps for forming the wires and others can be implemented without making the process steps complicated and increasing a process cost, in a simple manner and at a low cost, using the standard Si semiconductor process steps adapted for miniaturization.

BRIEF DESCRIPTION OF THE DRAWINGS

FIG. 1 is a view schematically showing a configuration of a nonvolatile semiconductor memory device according to Embodiment 1 of the present invention, in which FIG. 1(a) is a plan view and FIG. 1(b) is a cross-sectional view taken in the direction along line 1B-1B of FIG. 1(a).

FIG. 2 is a view schematically showing a configuration of a nonvolatile semiconductor memory device according to Embodiment 1 of the present invention, in which FIG. 2(a) is a plan view and FIG. 2(b) is a cross-sectional view taken in the direction along line 2B-2B of FIG. 2(a).

Figure 1:
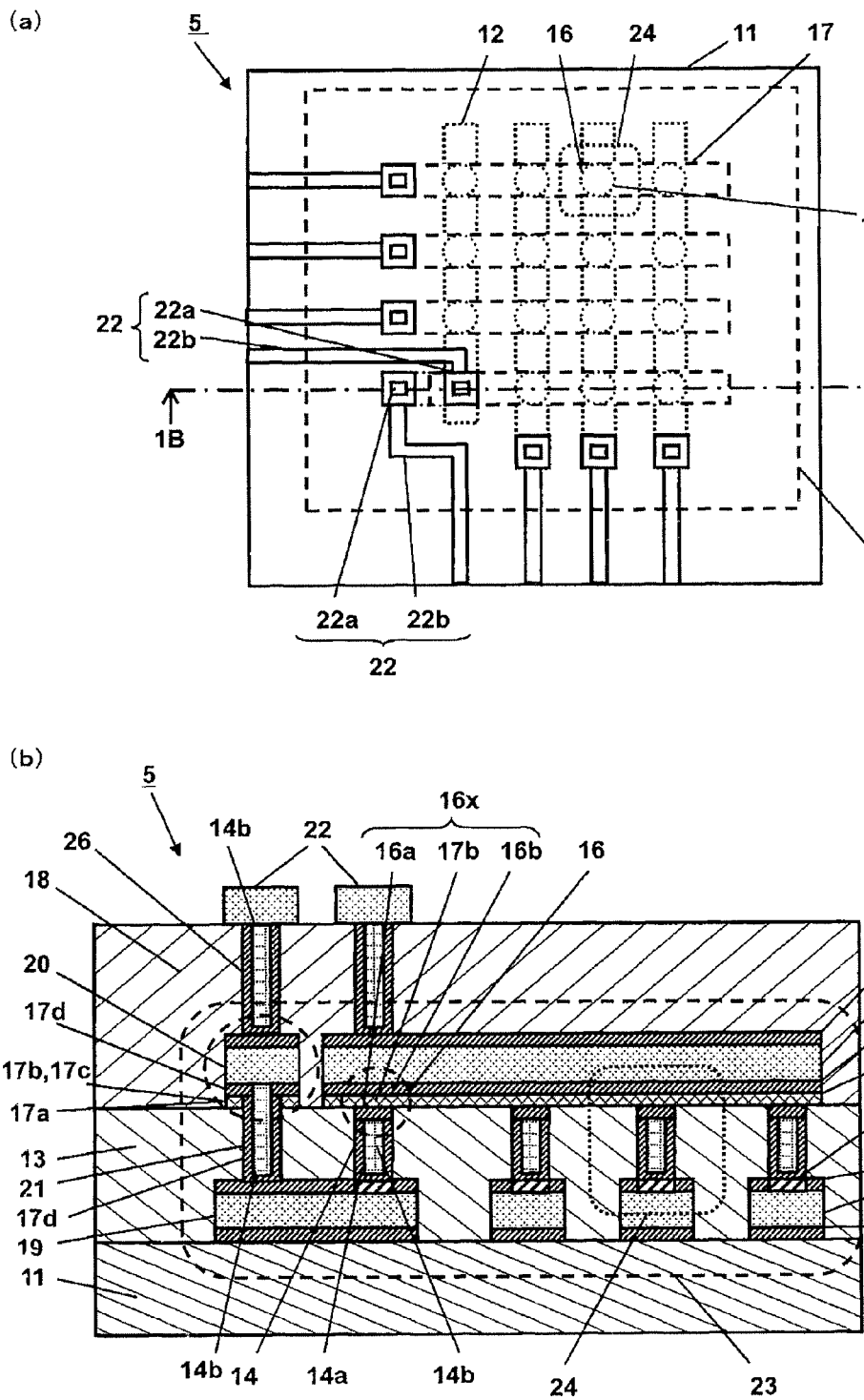

DESCRIPTION OF THE REFERENCE NUMERALS 5, 10, 30, 40, 50, 60, 70 nonvolatile semiconductor memory device
11 substrate
11a semiconductor substrate
12 first memory wires
12a, 14b, 17e, 42d, 47b conductive layer
12b, 12c, 17d, 42e barrier layer
12d tantalum nitride layer
13 first interlayer insulating layer
14 memory cell holes
14a, 47a barrier layer (conductive layer)
15 first resistance variable layer (resistance variable layer)
16 first non-ohmic elements (non-ohmic elements)
16a, 48a lower electrodes
16b, 48b upper electrodes
16c conductive layer
16x, 48x MSM diodes
16y Schottky diodes
16z pn-junction diodes
17 second memory wires
17a lowermost layer
17b, 42b semiconductor layer
17c, 42c insulator layer
17f semiconductor layer
17g metal electrode layer
17h p-type semiconductor layer
17j n-type semiconductor layer
17k trenches into which second memory wires are filled
18 second interlayer insulating layer
18a second interlayer insulating layer (lower side/layer for filling space between second memory wires, between wires of peripheral circuit)
19 first wire layer
20 second wire layer
20a, 20b wires in peripheral circuit
20c trenches into which wires in peripheral circuit are filled
21 first contacts
21a first contact holes
22, 28 upper wires
22a wire pad portion
22b wire portion
23, 41 cross-point memory section
24 memory cells
25 transistors
26 second contacts
27 peripheral circuit region 29a third contacts
29b fourth contacts
29c third contact holes
31 lower wires
32 lower contacts
32a contact holes
33 (33a, 33b) interlayer insulating layer
42 third memory wires
43 third interlayer insulating layer
44 fifth contacts
45 sixth contacts
46 second memory cell holes
47 second resistance variable layer
48 second non-ohmic elements
49 third wire layer

BEST MODE FOR CARRYING OUT THE
INVENTION

Hereinafter, embodiments of the present invention will be described with reference to the drawings. Hereinafter, the same constituents are identified by the same reference numerals and will not be described repetitively. In addition, the shapes of transistors, memory sections and others are schematically drawn and the numbers of them are set for easy illustration.

As used herein, a wire layer is meant to include all wires formed within the same flat plane, which are memory wires in a memory cell region and peripheral circuit wires in a peripheral circuit region adjacent to the memory cell region. The memory wires refer to wires which have a stripe shape and are directly connected to the memory cells. The shape of the peripheral circuit wires is arbitrary.

Embodiment 1

FIG. 1 is a view schematically showing a configuration of a nonvolatile semiconductor memory device according to Embodiment 1 of the present invention, in which FIG. 1(a) is a plan view and FIG. 1(b) is a cross-sectional view taken in the direction along line 1B-1B of FIG. 1(a).
[Configuration Including Only Memory Cell Region]

As shown in FIG. 1(a), a nonvolatile semiconductor memory device 5 of this Embodiment includes a substrate 11, first memory wires 12 of a stripe shape which are formed on the substrate 11, second memory wires 17 of a stripe shape crossing the first memory wires 12 perpendicularly to the first memory wires 12, respectively, and memory cells 24 sandwiched between the first memory wires 12 and the second memory wires 17. As described in detail later with reference to FIG. 1(b), each memory cell 24 is configured such that a first resistance variable layer 15 is electrically connected in series with a first non-ohmic element 16 via a conductive layer 14a and a conductive layer 14b. As shown in FIG. 1(a), memory cells 24 are arranged in matrix to form a cross-point memory section 23 which is a memory cell region. The cross-point memory section 23 is configured to include the memory cells 24 arranged in matrix, and upper wires 22 which are lead-out wires connected to the first memory wires 12 and the second memory wires 17 which sandwich the memory cells 24, respectively. Each upper wire 22 includes a wire pad portion 22a directly connected to a second contact and a wire portion 22b and is connected to a circuit other than the memory cell region via the wire portion 22b.

FIG. 1(b) is a detailed cross-sectional view of the nonvolatile semiconductor memory device 5 of this Embodiment, when viewed in the direction along line 1B-1B of FIG. 1(b).

As shown in FIG. 1(b), the nonvolatile semiconductor memory device 5 of this Embodiment includes the substrate 11, first memory wires 12 of a stripe shape which are formed on the substrate 11, a first interlayer insulating layer 13 formed over the first memory wires 12, first memory cell holes 14 formed in the first interlayer insulating layer 13 on the first memory wires 12, and first resistance variable layers 15 connected to the first memory wires 12 via the memory cell holes 14, respectively. Further, the nonvolatile semiconductor memory device 5 includes first non-ohmic elements 16 formed on the first resistance variable layers 15, respectively, the second memory wires 17 of a stripe shape which are formed on the first interlayer insulating layer 13 and cross the first memory wires 12 perpendicularly to the first memory wires 12, respectively, and a second interlayer insulating layer 18 formed over the second memory wires 17. Each second memory wire 17 has a plurality of layers including at least a portion of each of the first non-ohmic element 16. The nonvolatile semiconductor memory device 5 includes a semiconductor layer 17b or an insulator layer 17c in a lowermost layer 17a of each second memory wire 17.

As shown in FIG. 1, a first wire layer 19 including the first memory wires 12 is connected to a second wire layer 20 including the second memory wires 17 via first contacts 21 penetrating the first interlayer insulating layer 13. Further, the first wire layer 19 is connected to and led out to the upper wires 22 via second contacts 26 connected to the second wire layer 20 and penetrating the second interlayer insulating layer 18. The first contacts 21 penetrate the semiconductor layer 17b or insulator layer 17c of the second wire layer 20.

Each first memory wire 12 has a structure in which a low-resistance conductive layer 12a is sandwiched between upper and lower conductive barrier layers 12b and 12c. In particular, the upper barrier layer 12b is desirably made of a material which is turned to be operable as a resistance variable layer by oxidation.

The first memory cell holes 14 are formed in the first interlayer insulating layer 13 in regions where the first memory wires 12 cross the second memory wires 17 perpendicularly to the second memory wires 17, respectively, as described above. Each first memory cell hole 14 is filled with a conductive barrier layer 14a of a bottomed cylinder shape which is contact with the first memory wire 12 and is formed on a sidewall surface and bottom surface thereof, a conductive layer 14b surrounded by the barrier layer 14a and a lower electrode 16a of the first non-ohmic element 16 which is formed on the barrier layer 14a and the conductive layer 14b. The first resistance variable layer 15 is embedded in a portion of the first memory wire 12 which is in contact with the first memory cell hole 14. The bottom portion of the barrier layer 14a is formed on the first resistance variable layer 15. Therefore, the conductive layer 14b is connected to the first memory wire 12 via the barrier layer 14a and the first resistance variable layer 15. In other words, the conductive layer 14b and the first memory wire 12 are configured not to be short-circuited by bypassing the first resistance variable layer 15.

Each second memory wire 17 comprises, for example, a semiconductor layer 17b of the first non-ohmic element 16, a conductive barrier layer 17d which becomes an upper electrode 16b of the first non-ohmic element 16, and a low-resistance conductive barrier layer 17e of the second memory wire 17, and the conductive barrier layer 17d of the second memory wire 17. In FIG. 1, the first non-ohmic element 16 is a MSM diode 16x having a stacked structure comprising three layers, which are the semiconductor layer 17b, the lower electrode 16a and the upper electrode 16b which are metal electrode layers sandwiching the semiconductor layer 17b. As described above, the upper electrode 16b which is closer to the first resistance variable layer 15 is filled into the first memory cell hole 14.

In the above configuration, the first memory wires 12 can be connected to the second memory wires 17 via the first contacts 21 with a shortest distance, even when the semiconductor layer 17b or the insulator layer 17c is incorporated into the wires in the cross-point memory section 23. In addition, wires for leading out the first memory wires 12 or the second memory wires 17 to the upper wires 22 can be formed easily with a shortest distance. Furthermore, in the configuration of the each memory cell 24 having a combination of the non-ohmic element 16 such as a diode element and the resistance variable layer 15, since the size of the MSM diode 16x can be set larger than the size of the resistance variable layer 15, for example, the MSM diode 16x can have a current supply capability to flow a sufficient current through the resistance variable layer 15. This makes it possible to achieve a nonvolatile semiconductor memory device which does not operate incorrectly and has high reliability and high-dense integration.

[Configuration Including Memory Cell Region and Peripheral Circuit Region]

Figure 2:
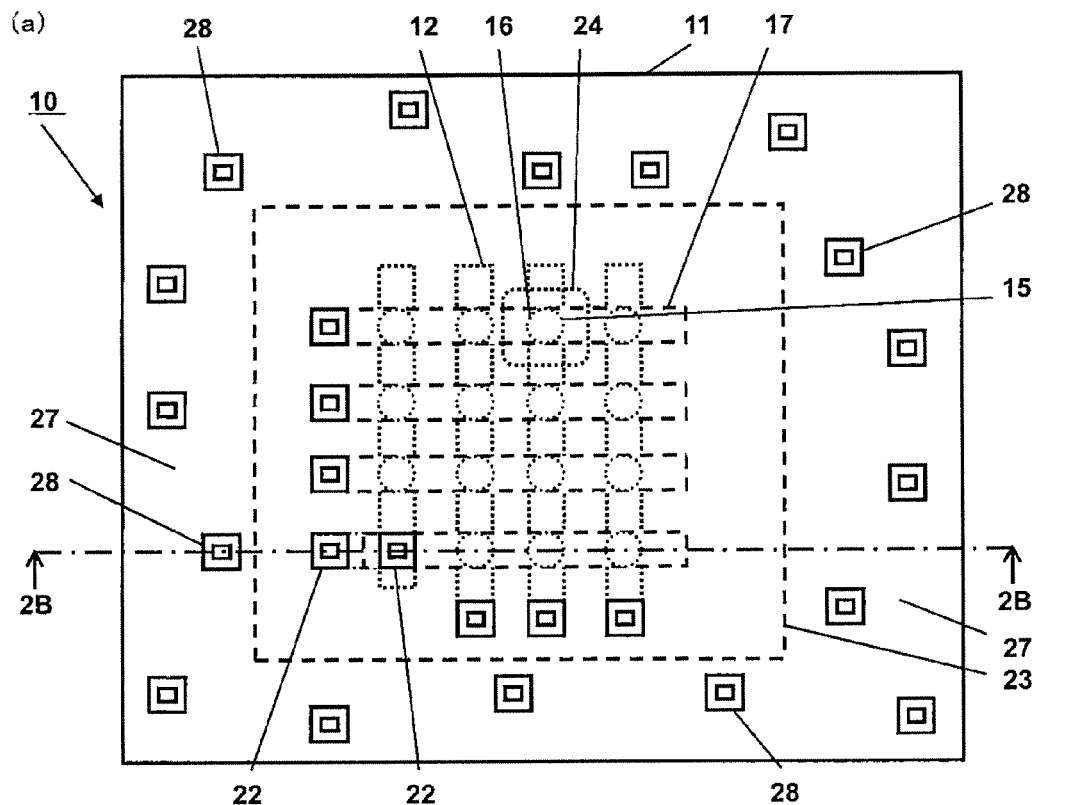
Figure 2:
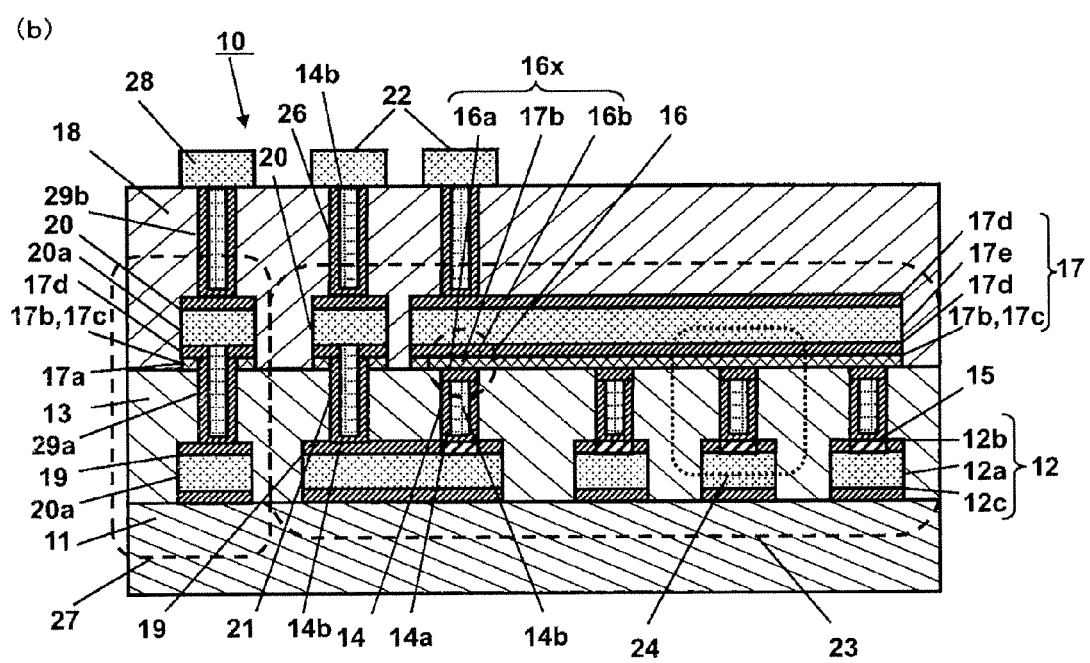

FIG. 2 is a view schematically showing a configuration of a nonvolatile semiconductor memory device according to Embodiment 1 of the present invention, in which FIG. 2(a) is a plan view and FIG. 2(b) is a cross-sectional view taken in the direction along line 1B-1B of FIG. 2(a). A nonvolatile semiconductor memory device 10 of FIG. 2 is configured to include a peripheral circuit section 27 adjacent to the memory cell region, in addition to the constituents of the nonvolatile semiconductor memory device 5 including the cross-point memory section 23 which is the memory cell region shown in FIG. 1.

In the configuration of FIGS. 2(a) and 2(b), the cross-point memory section 23 and others of the nonvolatile semiconductor memory device 10 which are the same as those of the nonvolatile semiconductor memory device 5 of FIG. 1, and therefore, they will not be described repetitively.

The nonvolatile semiconductor memory device 10 of FIG. 2(a) includes a peripheral circuit section 27 adjacent to the cross-point memory section 23 around the cross-point memory section 23, and is provided with upper wires 28 including a plurality of wire pad portions to enable connection with various circuits formed in the peripheral circuit section 27.

The nonvolatile semiconductor memory device 10 of FIG. 2(b) includes memory cells 24 each of which comprises the first resistance variable layer 15 and the non-ohmic element 16 which are electrically connected in series and each of which is disposed between the first memory wire 12 and the second memory wire 17. The nonvolatile semiconductor memory device 10 includes the cross-point memory section 23 which is the memory cell region in which the memory cells 24 are arranged in matrix and the peripheral circuit section 27 adjacent to the cross-point memory section 23. Each wire 20a in peripheral circuit which is the wire in the peripheral circuit section 27 is formed by at least one of the first wire layer 19 and the second wire layer 20 in the memory cell section 23. The first wire layer 19 and the second wire layer 20 in the peripheral circuit section 27 are connected to each other via a third contact 29a penetrating the first interlayer insulating layer 13, while the second wire layer 20 and the upper wire 28 in the peripheral circuit section 27 are connected to each other via a fourth contact 29b penetrating the second interlayer insulating layer 18. The third contacts 29a penetrate the semiconductor layer 17b or the insulator layer 17c of the second wire layer 20.

In such a configuration, the wires in the cross-point memory section 23 and the wires 20a in the peripheral circuit can be formed concurrently as the wire layer on the same flat plane, even when the semiconductor layer 17b or the insulator layer 17c is incorporated into the wires in the cross-point memory section 23 and the wires 20a in the peripheral circuit. And, the wire in the cross-point memory section 23 and the wire 20a in the peripheral circuit can be led out to the upper wire 22 and the upper wire 28, respectively, with a shortest distance. Therefore, it is possible to manufacture a nonvolatile semiconductor memory device without substantially increasing the masks and the process steps in number in the manufacturing steps.

In the above configuration, the low-resistance conductive layer 12a of the first memory wire 12 and the low-resistance conductive layer 17e of the second memory wire 17 desirably have a stacked structure in which, for example, copper or aluminum, and a barrier metal such as titanium nitride, titanium, tantalum nitride, or tantalum, are stacked together such that the barrier metal is stacked on and under the copper or aluminum. The former materials can provide a lower-resistance wire to prevent a delay in a circuit operation and achieve a high-speed operation. The latter materials can effectively prevent diffusion of impurities from the interlayer insulating layer and effectively improve adhesiveness to the interlayer insulating layer.

As the first non-ohmic element 16, a MSM diode 16x may be used, in which, for example, tantalum, tantalum nitride, titanium, titanium nitride, aluminum, tungsten, platinum or copper or a combination of these is used for the lower electrode 16a and the upper electrode 16b, silicon, silicon nitride or silicon carbide is used for the semiconductor layer 17b, and the material of the lower electrode 16a and the upper electrode 16b and the material of the semiconductor layer 17b are stacked together.

The semiconductor layer 17b of the first non-ohmic element 16 desirably has a larger size than the lower electrode 16a filled in the first memory cell hole 14, to improve a current supply capability of the MSM diode 16x which is the first non-ohmic element 16. By using the MSM diode 16x, it is possible to easily attain the first non-ohmic element 16 which has a bidirectionally large current supply capability and has a characteristic with a less variation, even when the first resistance variable layer 15 is so-called a bipolar resistance variable layer which changes its resistance in response to positive and negative voltages applied.

As the first interlayer insulating layer 13, insulative oxide material or nitride material may be used. To be specific, silicon oxide (SiO) deposited by the CVD process, or a TEOS-SiO layer deposited using ozone ($O_3$) and tetraethoxysilane (TEOS) by the CVD process, or a silicon nitride (SiN) layer may be used. Alternatively, the first interlayer insulating layer 13 may have a multi-layer structure including an insulative oxide layer and an insulative barrier layer.

The first resistance variable layer 15 is located under the first memory cell holes 14 and is surrounded from right and left sides by the conductive barrier layer formed as the upper layer of the first memory wire 12. As shown in FIG. 1, the conductive layer 12a and conductive barrier layer 12c of the first memory wires 12 are provided to protrude outward relative to the first resistance variable layer 15, the conductive barrier layer 17d of the second memory wires 17 is provided to protrude outward relative to the first resistance variable layer 15, and the barrier layer 14a is provided outside the conductive layer 14b of the first memory cell holes 14. This enables the first resistance variable layer 15 to have a structure for preventing invasion of impurities such as hydrogen which would otherwise degrade a resistance changing characteristic for changing a retained resistance value. As a result, it is possible to achieve a nonvolatile semiconductor memory device 5 having a stable resistance changing characteristic.

Although the first resistance variable layer 15 is formed at the bottom portion of the first memory cell hole 14 in this Embodiment, it may alternatively be filled into the first memory cell hole 14.

The first resistance variable layer 15 may be formed using, transition metal oxides, for example, iron-containing oxide such as triiron tetraoxide ($Fe_3O_4$), titanium oxide, tantalum oxide, vanadium oxide, cobalt oxide, nickel oxide, zinc oxide, or niobium oxide layer, by the sputtering process or the like.

The first contacts 21, the second contacts 26, the third contacts 29a and the fourth contacts 29b comprise tungsten or copper. Or, these contacts are filled with tungsten or copper, and the conductive layer 14b which comprises a combination of titanium, titanium nitride, tantalum and tantalum nitride and is formed on a sidewall surface and underlying layer of the tungsten or copper.

[Configuration Including Memory Cell Section, Peripheral Circuit Section and Drive Circuit]

Figure 3:
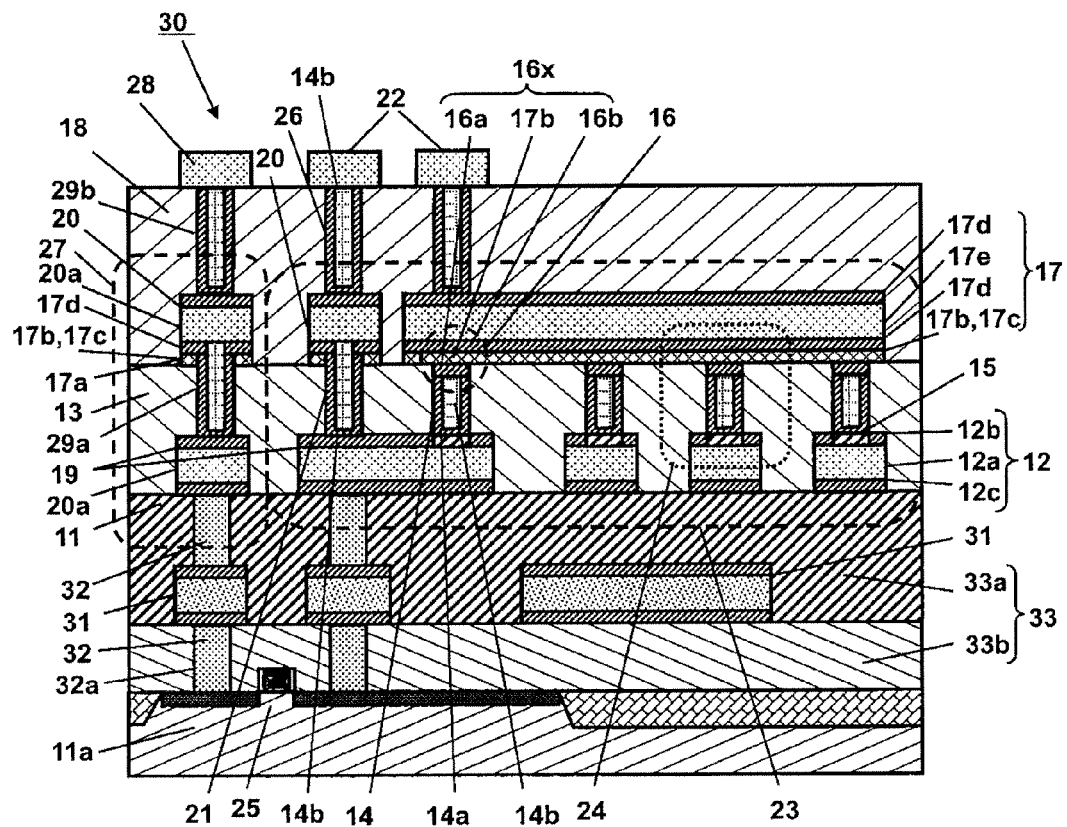
FIG. 3 is a cross-sectional view schematically showing a configuration of another nonvolatile semiconductor memory device according to Embodiment 1 of the present invention.

FIG. 3 is a cross-sectional view schematically showing a configuration of another nonvolatile semiconductor memory device 30 according to Embodiment 1 of the present invention. The nonvolatile semiconductor memory device 30 is different from the nonvolatile semiconductor memory device 10 of FIG. 1 in that the nonvolatile semiconductor memory device 30 includes drive circuits in a lower layer.

To be specific, in the nonvolatile semiconductor memory device 30 of FIG. 3, the first memory wires 12 in the cross-point memory section 23 are connected to at least one of transistors 25 in a layer underlying the first resistance variable layers 15 and the first memory wires 12.

As shown in FIG. 3, the drive circuit including the transistors 25 formed on a semiconductor substrate 11a, a lower wires 31 within the drive circuit, the first memory wires 12 in the cross-point memory section 23 and the wires 20a in the peripheral circuit adjacent to the cross-point memory section 23 are electrically connected to each other via lower contacts 32 as desired, respectively. As shown in FIG. 3, the lower contacts 32 are formed inside the contact holes 32a penetrating interlayer insulating layer 33 (33a, 33b) disposed in a lower layer.

In the above described structure, a common wire layer is used for the memory wires 17 in the cross-point memory section 23 and the wires 20a in peripheral circuit, and the wires can be connected to each other via the contacts with a shortest distance. This makes it possible to improve reliability and reduction in a connection resistance, thereby achieving a high-speed memory operation.

Since a part of the diode element is integrated into a wire structure, a current supply capability of the diode element can be increased without increasing a chip area. Thus, it is possible to achieve a nonvolatile semiconductor memory device which can ensure a sufficient current supply capability in a cross-point configuration having a combination of a diode element and a resistance variable layer.

In the configuration having a combination of the memory element and the diode element as describe above, cross talk at the time of reading or writing can be further lessened by utilizing a current steering characteristic of the diode, and a circuit configuration therefor can be simplified.

Next, a manufacturing method of a nonvolatile semiconductor memory device of this Embodiment will be described.

FIGS. 4(a) to 4(d) and FIGS. 5(a) to 5(c) are schematic cross-sectional views of a process step flow showing the manufacturing method of the nonvolatile semiconductor memory device of this Embodiment. Here, the nonvolatile semiconductor memory device 10 will be described, by way of example.

Figure 4:
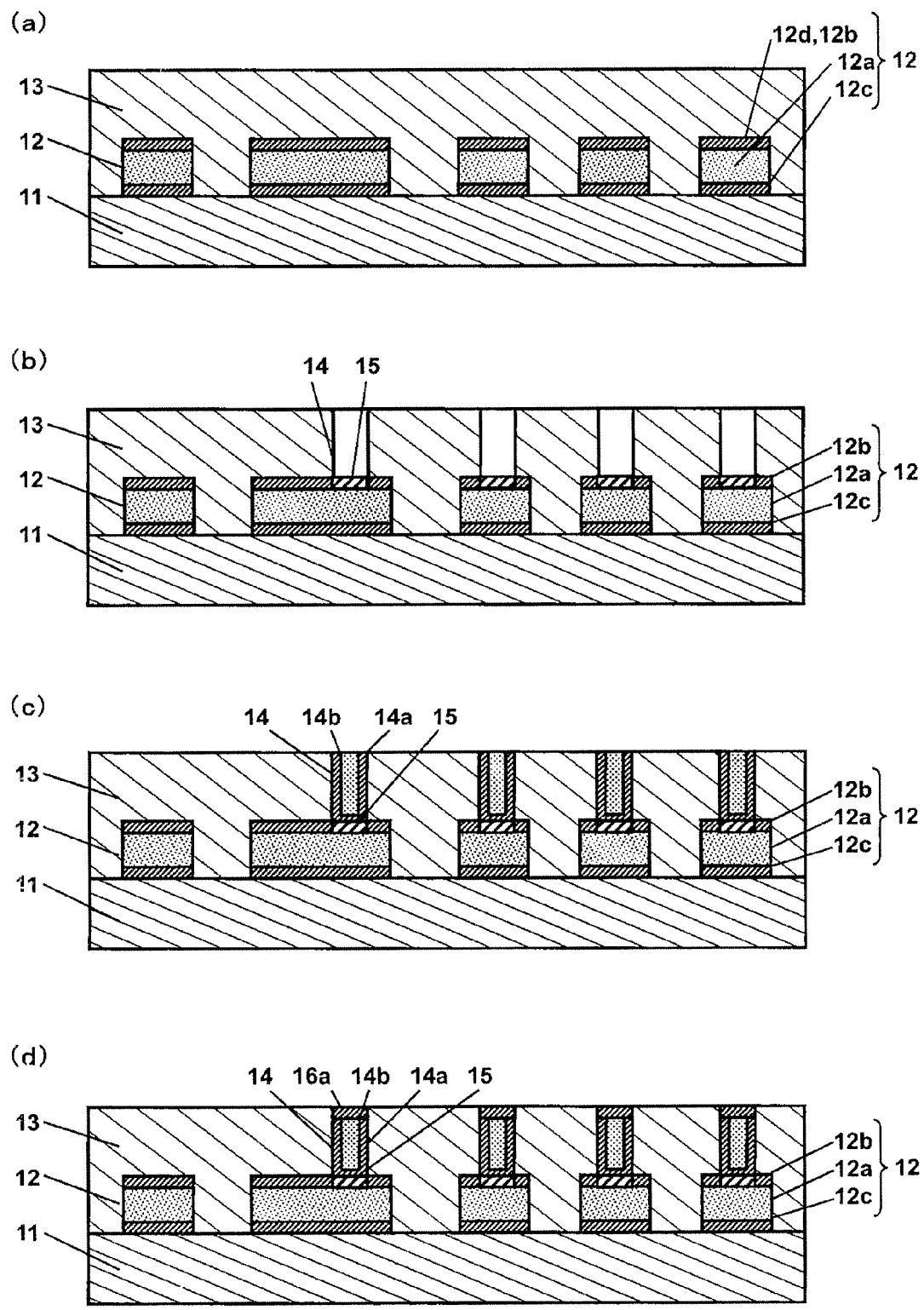
FIGS. 4(a) to 4(d) are schematic cross-sectional views of a process step flow (former half part), showing a manufacturing method of the nonvolatile semiconductor memory device according to Embodiment 1 of the present invention.
Figure 5:
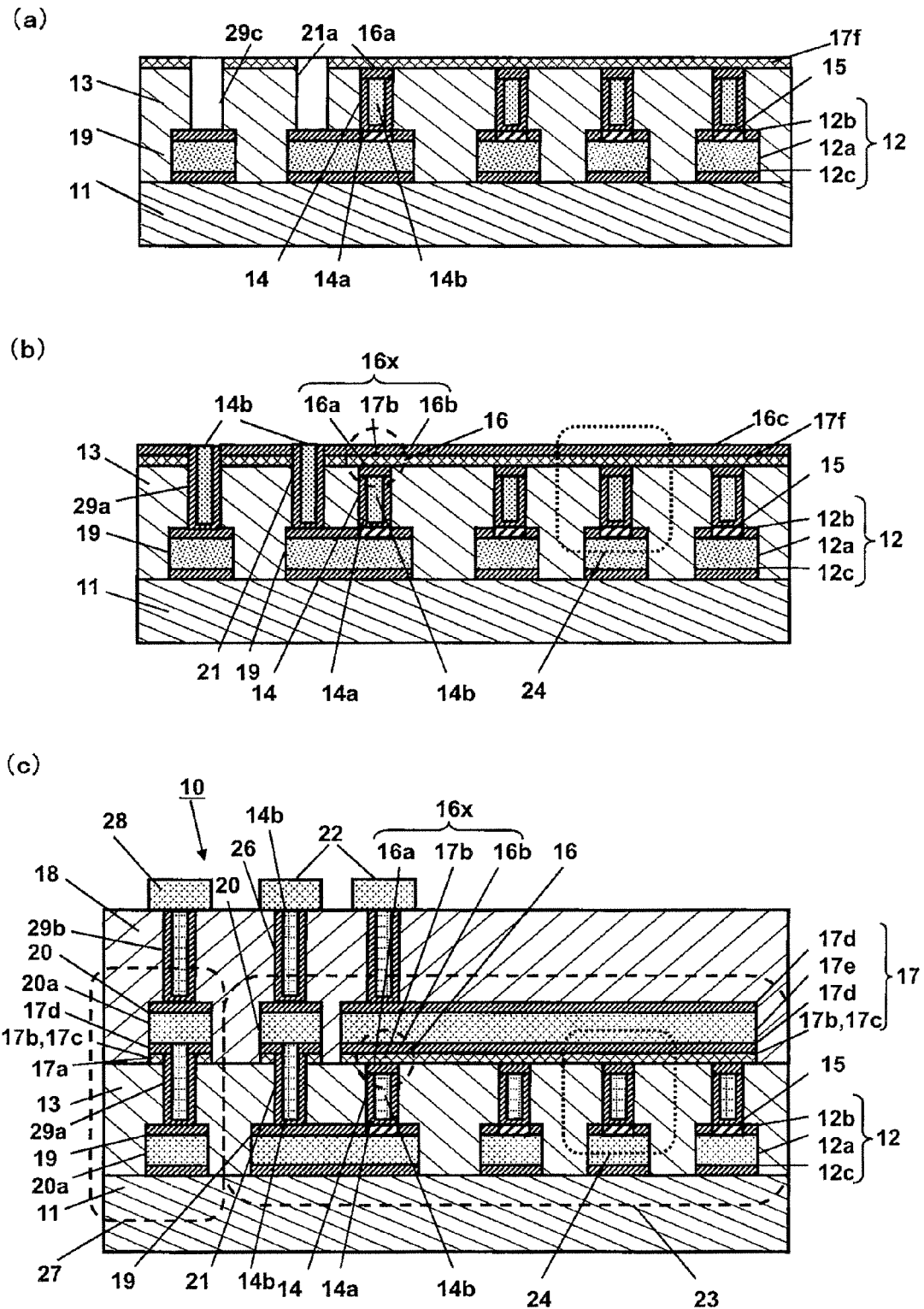
FIGS. 5(a) to 5(c) are schematic cross-sectional views of a process step flow (latter half part), showing a manufacturing method of the nonvolatile semiconductor memory device according to Embodiment 1 of the present invention.

As shown in the process step flowchart of FIGS. 4 and 5, the manufacturing method of the nonvolatile semiconductor memory device 10 of this Embodiment includes a step for forming the first memory wires 12 of a stripe shape on the substrate 11, a step for forming the first interlayer insulating layer 13 on the substrate 11 provided with the first memory wires 12, a step for forming the first memory cell holes 14 in predetermined positions of the first interlayer insulating layer 13 on the first memory wires 12 and a step for filling the first resistance variable layers 15 into the first memory cell holes 14, respectively. The manufacturing method of the nonvolatile semiconductor memory device 10 of this Embodiment includes a step for filling at least one layer in a stacked structure constituting the first non-ohmic element 16 into the upper portion of each first memory cell hole 14 and a step for forming the semiconductor layer 17b or insulator layer 17c in the stacked structure constituting the first non-ohmic elements 16, over the first interlayer insulating layer 13 such that the semiconductor layer 17b or the insulator layer 17c covers the first memory cell holes 14. Furthermore, the manufacturing method of the nonvolatile semiconductor memory device 10 of this Embodiment includes a step for forming the first contacts 21 on the first memory wires 12 such that each first contact 21 penetrates the first interlayer insulating layer 13 and the semiconductor layer 17b or insulator layer 17c in the stacked structure, and a step for forming the second memory wires 17 on the first interlayer insulating layer 13 and the semiconductor layer 17b or the insulator layer 17c in the stacked structure such that the second memory wires 17 cover at least a part of the first contacts 21.

Subsequently, the manufacturing method of the nonvolatile semiconductor memory device 10 of this Embodiment will be described specifically with reference to FIGS. 4 and 5 sequentially.

FIG. 4(a) is a cross-sectional view showing a state where after the first memory wires 12 of a stripe shape are formed on the substrate 11 by patterning a conductive layer using a desired mask, the first interlayer insulating layer 13 is formed and then is planarized by CMP.

As shown in FIG. 4(a), a barrier layer 12c which has adhesiveness, conductivity and a barrier property and is made of, for example, tantalum nitride or tantalum, are formed on the substrate 11. On the barrier layer 12c, the low-resistance conductive layer 12a which is made of, for example, aluminum or copper is formed. Then, on the conductive layers 12a, a material which has adhesiveness, conductivity and a barrier property and is turned to resistance variable layers by oxidation, for example tantalum nitride layers 12b is formed, and patterning is performed to leave regions required for the wires, thereby forming the first memory wires 12. Although the first memory wires 12 are formed by etching, they may be formed by a damascene process.

After the first memory wires 12 are formed by patterning, an oxide which becomes the first interlayer insulating layer 13 is deposited by, for example, a CVD process, and is planarized by CMP. The first interlayer insulating layer 13 may be made of fluorine-containing oxide to reduce a parasitic capacitance between wires. Or, the first interlayer insulating layer 13 may have a multi-layer structure including an insulative barrier layer.

Then, as shown in FIG. 4(b), the first memory cell holes 14 are formed in desired positions on the first memory wires 12 to penetrate the first interlayer insulating layer 13. The tantalum nitride layer 12b formed in the uppermost layer of each first memory wire 12 is changed to tantalum oxide by oxygen ashing or oxygen ion implantation from above the first interlayer insulating layer 13, by utilizing a space of the first memory cell hole 14. In this way, the first resistance variable layer 15 is formed within the tantalum nitride layer 12b. Alternatively, a material which becomes a resistance variable layer may be filled into each first memory cell hole 14 by a sputtering process or a CVD process.

As shown in FIG. 4(c), the conductive layer 14a which is, for example, a tantalum nitride layer or a titanium nitride layer, which has a barrier property and adhesiveness, is deposited on a sidewall surface and bottom surface of each first memory cell hole 14, by the sputtering process, an attached material is removed by double-sided scrubber, the low-resistance conductive layer 14b such as tungsten is filled into each first memory cell hole 14 by the CVD process, and is planarized by CMP.

Then, as shown in FIG. 4(d), a portion of the surface of the barrier layer 14a and a portion of the surface of the conductive layer 14b which are filled into each first memory cell hole 14 is removed by an etch-back process, and a tantalum nitride layer is deposited over the entire surface, by, for example, the sputtering process. After that, a portion of the tantalum nitride layer outside the first memory cell hole 14 is removed and planarized by CMP, thereby forming the lower electrode 16a of MSM diode which is the first non-ohmic element, on the upper portion of each first memory cell hole 14.

Then, as shown in FIG. 5(a), a semiconductor layer 17f which becomes the semiconductor layers of MSM diodes, is formed over the entire surface of the upper portions of the first memory cell holes 14 and over the entire surface of the upper portion of the first interlayer insulating layer 13, and the first contact holes 21a and the third contact holes 29c are formed on the first wire layer 19 including the first memory wires 12 in positions where these contacts are to be formed, to penetrate the first interlayer insulating layer 13 and the semiconductor layer 17f. As the semiconductor layer 17f for example, silicon nitride is deposited by the sputtering process. When forming the MIM diode element, an insulator layer is used instead of the semiconductor layer.

Then, as shown in FIG. 5(b), the conductive layer 16c which becomes the upper electrodes 16b of MSM diodes is deposited over the upper portion of the semiconductor layer 17f. As the conductive layer 16c, a tantalum nitride layer, a titanium layer or a titanium nitride layer which has a barrier property and adhesiveness is deposited by the sputtering process. When the conductive layer 16c is deposited over the entire surface of the upper portion of the semiconductor layer 17f, it is concurrently deposited on the sidewall surface and bottom surface of each first contact hole 21a and on the sidewall surface and bottom surface of each third contact hole 29c, and then tungsten is filled into each first contact hole 21a and each third contact hole 29c by CVD. Then, tungsten outside the first contacts 21 and the third contacts 29a is removed and planarized by the CMP, thereby forming the first contacts 21 inside the first contact holes 21a, respectively, and the third contacts 29a inside the third contact holes 29c, respectively such that the conductive layer 14b is filled in each of the first contacts 21 and each of the third contacts 29.

Then, as shown in FIG. 5(c), the second memory wires 17 of a stripe shape are formed to cross the first memory wires 12 perpendicularly to the first memory wires 12, respectively, the second memory wires 17 are formed on the first contacts 21, respectively and the wires 20a in peripheral circuit are formed on the third contacts 29a, respectively, such that the second memory wires 17 and the wires 20a are formed by the same wire layer, i.e., the second wire layer 20 concurrently. The second memory wires 17 formed on each first memory hole 14 comprise the semiconductor layer 17b of the MSM diode 16x, the upper electrode 16b of the MSM diode 16x, the low-resistance conductive layer 17e and the barrier layers 17d. The second memory wires 17 may have a multi-layer structure including other layers in addition to the stacked structure constituting the first non-ohmic element 16 described above. The barrier layer 17d is desirably formed by a tantalum nitride layer. The semiconductor layer 17b and the upper electrode 16b desirably have a larger size than at least the size of the first memory cell hole 14, to improve a current supply capability of the MSM diode 16x.

Although each first memory wire 12 has a multi-layer structure and each second memory wire 17 has a multi-layer structure, the structure is not limited to this, but may be simplified.

The each wire 20a in peripheral circuit on each third contact 29a is electrically connected to the corresponding first wire layer 19 in a good condition via the corresponding third contact 29a penetrating the semiconductor layer 17b which is the lowermost layer of the second memory wire 17.

Then, as shown in FIG. 5(c), after the second interlayer insulating layer 18 is formed over the first interlayer insulating layer 13 and the second wire layer 20 including the second memory wires 17, the second contacts 26 and fourth contacts 29b are formed to penetrate the second interlayer insulating layer 18 such that each second contact 26 is electrically connected to the upper wire 22 on the second interlayer insulating layer 18 and each fourth contact 29b is electrically connected to the upper wire 28 on the second interlayer insulating layer 18.

In such a method, the first memory wire 12 can be connected to the second memory wire 17 via the first contact 21 with a shortest distance, and the wires in the cross-point memory section 23 and the wires 20a in peripheral circuit are formed concurrently as the wire layer on the same flat plane. In addition, in the configuration of the each memory cell 24 having a combination of the non-ohmic element such as the diode element and the resistance variable layer, since the size of the diode element can be made larger than the size of the resistance variable layer, for example, the diode element can have a current supply capability to flow a sufficient current through the resistance variable layer. This makes it possible to achieve a nonvolatile semiconductor memory device which does not operate incorrectly and has high reliability and high-dense integration. In addition, since standard Si semiconductor process steps adapted for miniaturization can be used, the number of the masks and the process cost can be reduced, and the process steps can be simplified.

Alternatively, it is possible to provide a memory cell including, as the first non-ohmic element, a diode element which has a MIM structure or a metal-semiconductor-metal (MSM) structure which enables an electrically bidirectionally symmetric operation, as well as a Schottky diode or a pn-junction diode.

In a further alternative, the diode electrodes 16a, 16b, 48a, 48b which serve as the electrodes of the first non-ohmic element 16 or the second non-ohmic element 48, in the second memory wires 17 and the third memory wires 42 may be made of the same material as the material used for contacting layers of the first contacts 21, the third contacts 29a, the fifth contacts 44 and the sixth contacts 45, which are adjacent to the first interlayer insulating layer 13 or the second interlayer insulating layer 18.

In such a configuration, since the diode electrodes and the contacting layers are made of the same material, the process steps can be simplified, and as a result, the nonvolatile semiconductor memory device can be manufactured without increasing the masks and the process steps in number in the manufacturing process.

[Modification]

Figure 12:
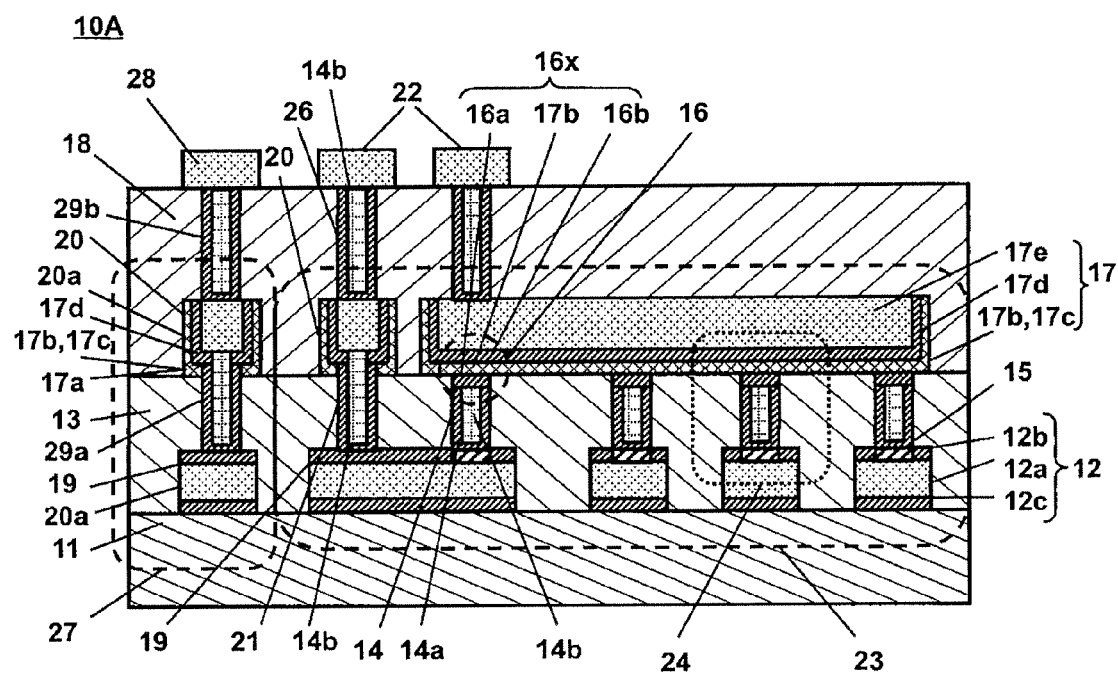
FIG. 12 is a cross-sectional view schematically showing a configuration of a modification of the nonvolatile semiconductor memory device according to Embodiment 1 of the present invention.

FIG. 12 is a cross-sectional view schematically showing a configuration of a modification of the nonvolatile semiconductor memory device according to Embodiment 1 of the present invention.

As shown in FIG. 12, a nonvolatile semiconductor memory device 10A of this modification is a modification of the nonvolatile semiconductor memory device 10 of FIG. 2. Although the modification of the nonvolatile semiconductor memory device 10 of FIG. 2, among the nonvolatile semiconductor memory devices in the above Embodiments will be described by way of example, a difference between the nonvolatile semiconductor memory device 10 of FIG. 2 and the nonvolatile semiconductor memory device 10A of this modification is the same for the nonvolatile semiconductor memory device 5 of FIG. 1 and the nonvolatile semiconductor memory device 30 of FIG. 3. Therefore, hereinafter, these nonvolatile semiconductor memory devices are collectively referred to as a nonvolatile semiconductor memory device of Embodiment 1, and a comparison between the nonvolatile semiconductor memory device of Embodiment 1 and the nonvolatile semiconductor memory device 10A of this modification will be explained. This modification is different from Embodiment 1 in a manufacturing method of the second memory wires 17. In Embodiment 1, the layer made of the material for the second memory wires 17 is formed over the first interlayer insulating layer 13 and is processed using a desired mask, thereby forming the second memory wires. In contrast, in this modification, the second memory wires 17 are formed by so-called a damascene process in such a manner that wire trenches are formed in the first interlayer insulating layer 13, and the material of the second memory wires 17 is filled into the wire trenches, respectively. To be specific, the semiconductor layer 17b or insulator layer 17c formed in the lower layer of each second memory wire 17 and in the lower layer of each wire 20a in peripheral circuit is also formed on a sidewall portion of each wire.

Therefore, in such a configuration, the semiconductor layer 17b or the insulator layer 17c is provided in the wire in the cross-point memory section 23 and the wire 20a in peripheral circuit, as in the configuration of Embodiment 1. In such a configuration, as in the configuration of Embodiment 1, the wires in the cross-point memory section 23 and the wires 20a in peripheral circuit can be formed concurrently as the wire layer on the same flat plane, and each wire in the cross-point memory section 23 and each wire 20a in the peripheral circuit can be led out to the upper wire 22 and the upper wire 28, respectively, in an easy manner and with a shortest distance. As a result, the nonvolatile semiconductor memory device can be manufactured without substantially increasing the number of masks and the number of process steps in the manufacturing process.

Since the materials and others of the various wires, the interlayer insulating layers and the non-ohmic elements in the above configuration are similar to those described in Embodiment 1, description thereof will be omitted.

Next, a manufacturing method of the nonvolatile semiconductor memory device 10A of this modification will be described.

FIG. 13(a) to FIG. 13(c) and FIGS. 14(a) to 14(c) are schematic cross-sectional views of the process step flow showing the manufacturing method of the nonvolatile semiconductor memory device of this modification, regarding the difference between the manufacturing method of Embodiment 1 and the manufacturing method of the modification. Hereinafter, a manufacturing method of the second wires 17 will be described mainly and the manufacturing method identical to that of Embodiment 1 will not be described repetitively.

Figure 13:
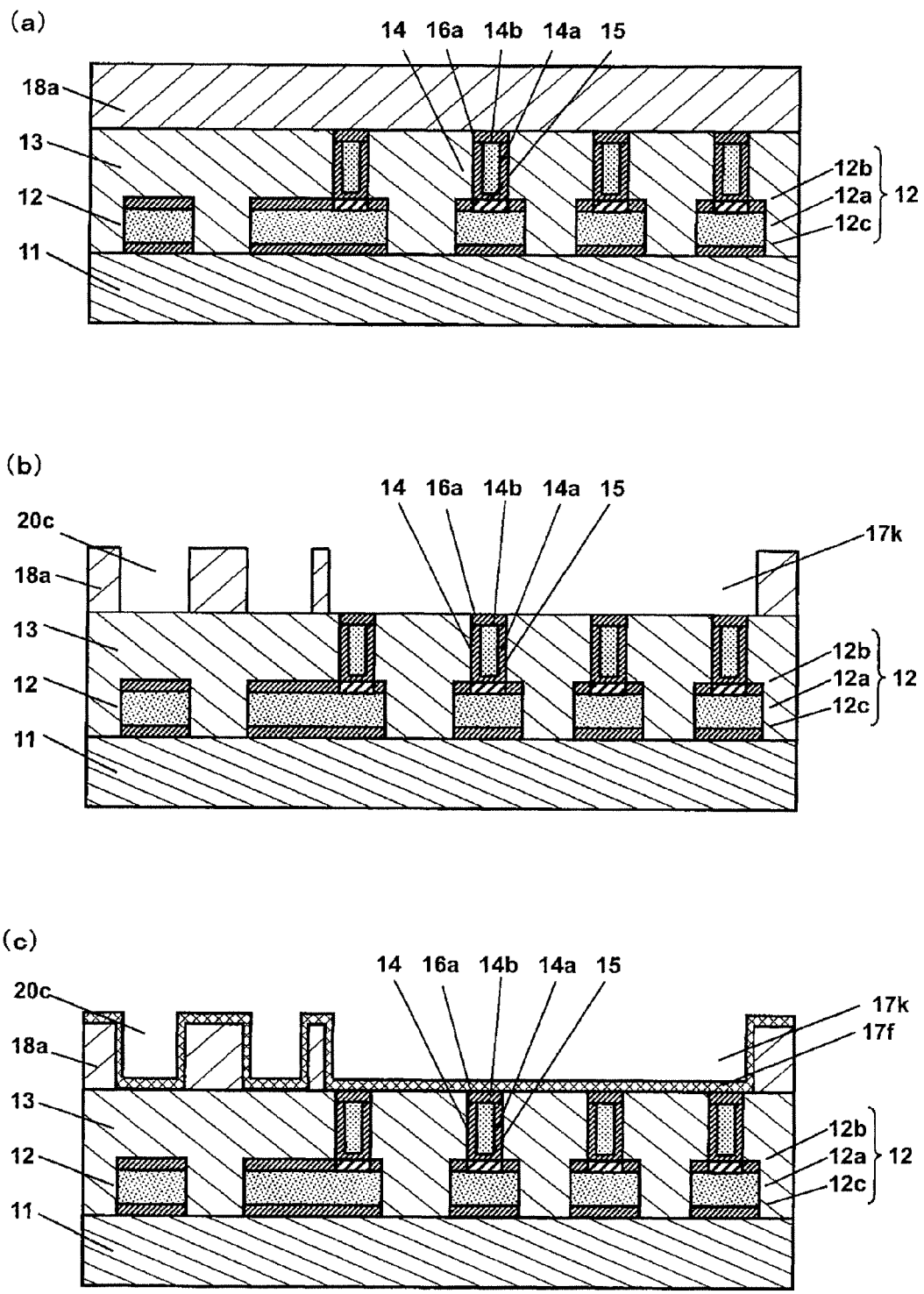
FIGS. 13(a) to 13(c) are schematic cross-sectional views of a process step flow (former half part), showing a manufacturing method of the modification of the nonvolatile semiconductor memory device according to Embodiment 1 of the present invention.

Initially, as shown in FIG. 13(a), a second interlayer insulating layer 18a which is as high as the second memory wires 17 and the wires 20a in peripheral circuit which will be fabricated later, is formed on the first memory cell holes 14 each including the lower electrode 16a of MSM diode which will become the first non-ohmic element, and over the entire upper surface of the upper portion of the first interlayer insulating layer 13.

Then, as shown in FIG. 13(b), using a desired mask, wire trenches 17k into which the second memory wires 17 are filled, and wire trenches 20c into which the wires 20a in peripheral circuit are filled, are formed in the second interlayer insulating layer 18a. In this case, the lower electrodes 16a of MSM diodes which will become the first non-ohmic elements and are filled into the upper portions of the first memory holes 14, respectively, are exposed at the bottom portions of wire trenches 17k. The wire trenches 17k are formed in a stripe shape to cross the first memory wires 12 perpendicularly to the first memory wires 12, respectively.

Then, as shown in FIG. 13(c), the semiconductor layer 17f, which will become the semiconductor layers of the MSM diodes, is formed over the entire surface of the second interlayer insulating layer 18a to cover the wire trenches 17k into which the second memory wires 17 are filled and the wire trenches 20c into which the wires 20a in peripheral circuit are filled. Herein, as the semiconductor layer 17f, silicon nitride is deposited by sputtering, for example. If the MIM diode elements are formed, an insulator layer is used instead of the semiconductor layer.

Figure 14:
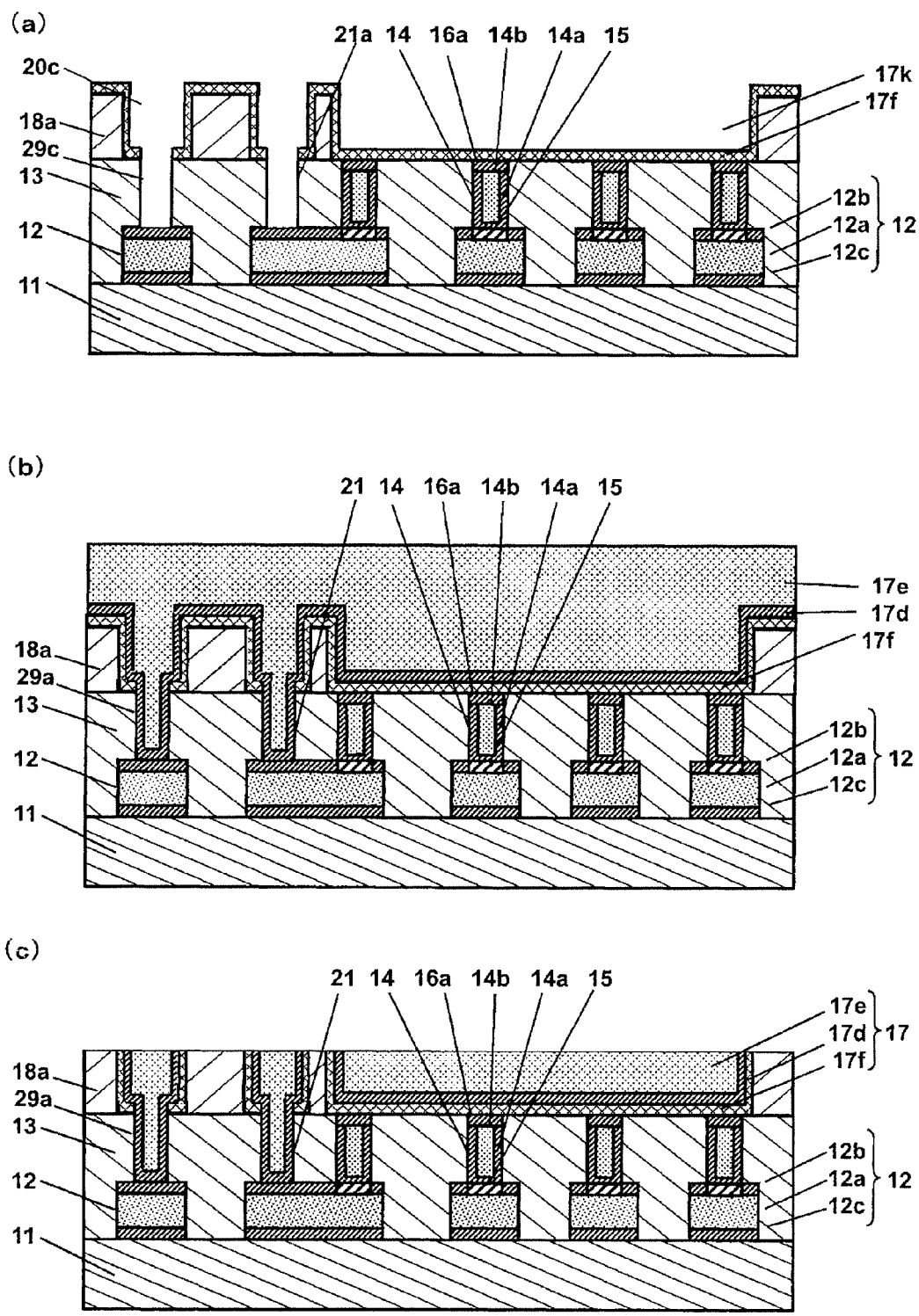
FIGS. 14(a) to 14(c) are schematic cross-sectional views of a process step flow (latter half part), showing a manufacturing method of the modification of the nonvolatile semiconductor memory device according to Embodiment 1 of the present invention.

Then, as shown in FIG. 14(a), using a desired mask, the first contact holes 21a and the third contact holes 29c are formed inside the wire trenches 17k into which the second memory wires 17 are filled and inside the wire trenches 20c into which the wires 20a in peripheral circuit are filled such that the first contact holes 21a and the third contact holes 29c penetrate the first interlayer insulating layer 13 and the semiconductor layer 17f. These contact holes enable electric connection with the first wire layer 19 including the first memory wires 12.

Then, as shown in FIG. 14(b), a conductive layer which will become the upper electrodes 17d of the MSM diodes is formed to cover the first contact holes 21a, the third contact holes 29c and the semiconductor layer 17f. As the conductive layer, a tantalum nitride layer, a titanium layer or a titanium nitride layer which has a barrier property and adhesiveness is deposited by the sputtering process. Further, a conductive layer 17e with a low resistivity is formed over the entire surface of the conductive layer such that the conductive layer 17e is filled into the first contact holes 21a and the third contact holes 29c, thereby forming the first contacts 21 and the third contacts 29a.

Finally, as shown in FIG. 14(c), CMP is performed for the purpose of planarization such that a portion of the conductive layer 17d and a portion of the conductive layer 17e which are formed above the second interlayer insulating layer 18a, thereby forming the second memory wires 17 and the wires 20a in peripheral circuit section.

Since the following steps are identical to those for the nonvolatile memory device of Embodiment 1, they will not be described repetitively.

In the above manufacturing method, it is possible to achieve a nonvolatile semiconductor memory device which does not operate incorrectly and has high reliability and high-dense integration. In addition, since the standard Si semiconductor process step adapted for miniaturization, to be specific, the damascene process can be used, the number of masks and the process cost can be reduced, and the process steps can be simplified.

Embodiment 2

Figure 6:
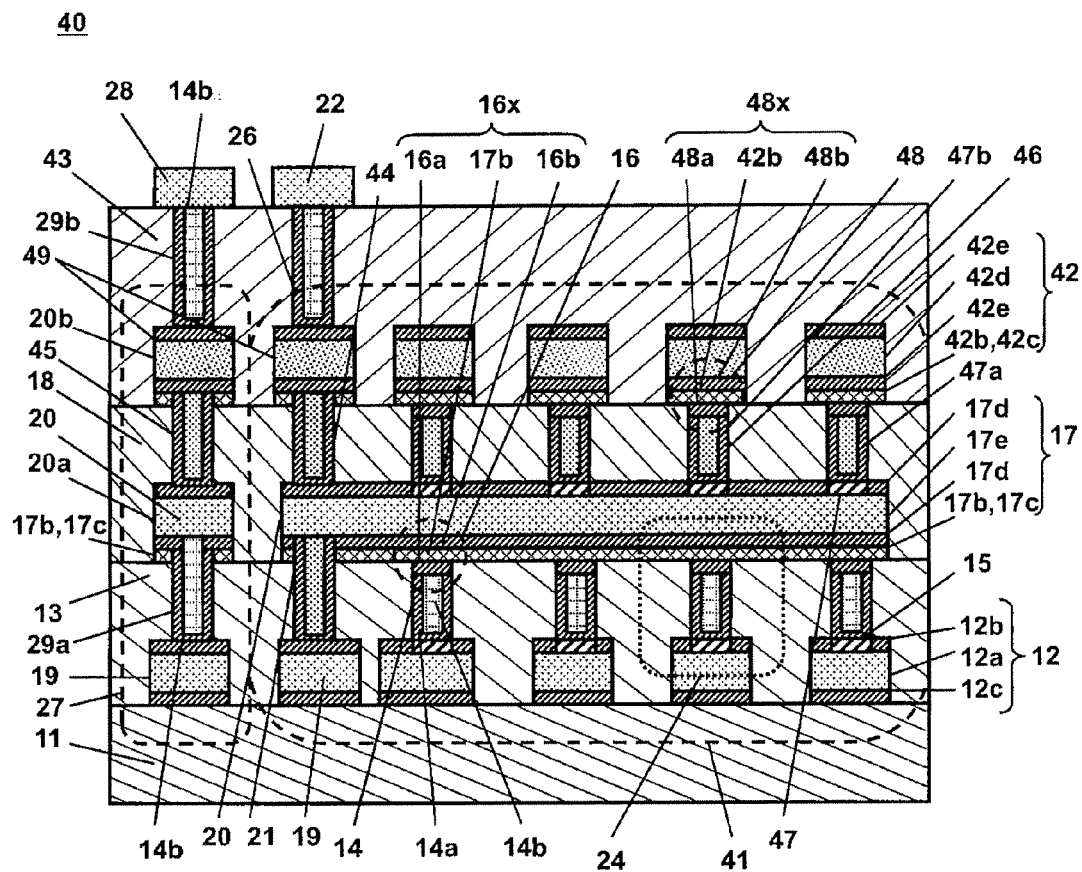
FIG. 6 is a cross-sectional view schematically showing a configuration of a nonvolatile semiconductor memory device according to Embodiment 2 of the present invention.

FIG. 6 is a cross-sectional view schematically showing a configuration of a nonvolatile semiconductor memory device according to Embodiment 2 of the present invention. Embodiment 2 is different from Embodiment 1 in that two layers of the cross-point memory sections 23 of the nonvolatile semiconductor memory device 10 of FIG. 2 are stacked together. To be specific, as shown in FIG. 6, a nonvolatile semiconductor memory device 40 of this Embodiment includes, on the first interlayer insulating layer 13, a second interlayer insulating layer 18 formed to cover the second wire layer 20 including the second memory wires 17 and the wires 20a in peripheral circuit, and third memory wires 42 of a stripe shape and wires 20b in peripheral circuit which are formed on the second interlayer insulating layer 18 such that the third memory wires 42 cross the second memory wires 17 perpendicularly to the second memory wires 17, respectively, in addition to the constituents of the nonvolatile semiconductor memory device 10. Furthermore, over the second interlayer insulating layer 18, a third interlayer insulating layer 43 is formed to cover the third memory wires 42 and the wires 20b in peripheral circuit. As shown in FIG. 6, in the cross-point memory section 41, the first memory wires 12, the second memory wires 17 and the third memory wires 42 are electrically connected to and led out to each upper wire 22 formed on the third interlayer insulating layer 43 via the first contacts 21, the second contacts 26 and the fifth contacts 44. Likewise, in the peripheral circuit section 27, the wires 20a and 20b in peripheral circuit are electrically connected to and led out to each upper wire 28 via the third contacts 29a, the fourth contacts 29b and the sixth contacts 45.

As shown in FIG. 6, the nonvolatile semiconductor memory device 40 includes the substrate 11, the first memory wires 12 formed on the substrate 11, the first interlayer insulating layer 13 formed over the first memory wires 12, the first memory cell holes 14 formed in the first interlayer insulating layer 13 on the first memory wires 12, the first resistance variable layers 15 connected to the first memory wires 12 via the first memory cell holes 14, respectively, and the first non-ohmic elements 16 formed on the first resistance variable layers 15, respectively. Further, the nonvolatile semiconductor memory device 40 includes the second memory wires 17 of a stripe shape which are formed on the first interlayer insulating layer 13 such that the second memory wires 17 cross the first memory wires 12 perpendicularly to the first memory wires 12, respectively, the second interlayer insulating layer 18 formed over the second memory wires 17, second memory cell holes 46 penetrating the second interlayer insulating layer 18 on the second memory wires 17, second resistance variable layers 47 connected to the second memory wires 17 via the second memory cell holes 46, respectively, second non-ohmic elements 48 formed on the second resistance variable layers 47, respectively, and third memory wires 42 of a stripe shape which are formed on the second interlayer insulating layer 18 such that the third memory wires 42 cross the second memory wires 17 perpendicularly to the second memory wires 17, respectively. In the nonvolatile semiconductor memory device 40, each second memory wire 17 is composed of a plurality of layers including at least a portion of the first non-ohmic element 16 and each third memory wire 42 is composed of a plurality of layers including at least a portion of the second non-ohmic element 48. The second memory wires 17 have a semiconductor layer 17b or an insulator layer 17c in a lowermost layer and the third memory wires 42 have a semiconductor layer 42b or an insulator layer 42c in a lowermost layer, respectively.

In addition to the above configuration, in the nonvolatile semiconductor memory device 40, the first wire layer 19 including the first memory wires 12 is connected to the second wire layer 20 including the second memory wires 17 via the first contacts 21 penetrating the first interlayer insulating layer 13. The second wire layer 20 including the second memory wires 17 is connected to the third wire layer 49 including the third memory wires 42 via the fifth contacts 44 penetrating the second interlayer insulating layer 18. Further, the second wire layer 20 is connected to and led out to the upper wire 22 via the second contact 26 connected to the third wire layer 49 and penetrating the third interlayer insulating layer 43. The first contacts 21 penetrate the semiconductor layer 17b or insulator layer 17c of the second wire layer 20, while the fifth contacts 44 penetrate the semiconductor layer 42b or insulator layer 42c of the third wire layer 49.

The second memory cell holes 46 are formed in regions where the second memory wires 17 cross the third memory wires 42 perpendicularly to the third memory wires 42, respectively such that the second memory cell holes 46 penetrate the second interlayer insulating layer 18. Inside each second memory cell hole 46, the second resistance variable layer 47 in contact with the second memory wire 17, the conductive layer 47b formed on the second resistance variable layer 47 and surrounded by the conductive barrier layer 47a, and the lower electrode 48a of the second non-ohmic element 48 are filled.

Each third memory wire 42 is composed of the semiconductor layer 42b of the second non-ohmic element 48, a low-resistance conductive layer 42d and barrier layers 42e. The second non-ohmic element 48 is, for example, a MSM diode 48x, like Embodiment 1. The MSM diode 48x is composed of the lower electrode 48a, the semiconductor layer 42b and the upper electrode 48b.

In such a configuration, the first memory wires 12 can be connected to the second memory wires 17 via the first contacts 21 with a shortest distance, while the second memory wires 17 can be connected to the third memory wires 42 via the second contacts 26 with a shortest distance. In addition, the electrodes and the lead-out wires of the memory cells 245 in the cross-point memory section 41 are formed concurrently as the wire layer on the same plat plane. Further, in the configuration of the memory cell 24 having a combination of the non-ohmic element such as the diode element and the resistance variable layer, since the size of the diode element can be made larger than the size of the resistance variable layer, for example, the diode element can have a current supply capability to flow a sufficient current through the resistance variable layer. This makes it possible to achieve a nonvolatile semiconductor memory device which does not operate incorrectly and has high reliability and high-dense integration.

In the nonvolatile semiconductor memory device 40 of FIG. 6, the each memory cell 24 is formed between the first memory wire 12 and the second memory wire 17 to include the first resistance variable layer 15 and the first non-ohmic element 16 which are electrically connected to each other, and between the second memory wire 17 and the third memory wire 42 to include the second resistance variable layer 47 and the second non-ohmic element 48 which are electrically connected to each other. The nonvolatile semiconductor memory device 40 includes the cross-point memory section 41 which is the memory cell region in which the memory cells 24 are arranged in matrix and the peripheral circuit section 27 adjacent to the cross-point memory section 41. The wires 20a and 20b in peripheral circuit which are wires in the peripheral circuit section 27 are each formed using at least one of the first wire layer 19, the second wire layer 20 and the third wire layer 49 in the memory cell region. In the peripheral circuit section 27, the wire layers are connected to each other or the wires are connected to each other via the first contacts 21, the second contacts 26, the third contacts 29a, the fourth contacts 29b, the fifth contacts 44 and the sixth contacts 45, which penetrate the first interlayer insulating layer 13, the second interlayer insulating layer 18 and the third interlayer insulating layer 43. Each of the first contact 21 and the third contact 29a penetrates the semiconductor layer 17b or insulator layer 17c of the second wire layer 20, each of the fifth contact 44 and the sixth contact 45 penetrates the semiconductor layer 42b or insulator layer 42c of the third wire layer 49.

In such a configuration, even when the semiconductor layer 17b or the insulator layer 17c and the semiconductor layer 42b or the insulator 42c are incorporated into the wires in the cross-point memory section 41 and the wires 20a and 20b in peripheral circuit, the wires in the cross-point memory section 41 and the wires 20a in peripheral circuit can be formed concurrently as the wire layer on the same flat plane, and the wires in the cross-point memory section 41 and the wires 20b in peripheral circuit can be formed concurrently as the wire layer on the same flat plane. In addition, the wires in the cross-point memory section 41 can be led out to the upper wires 22 easily with a shortest distance, and each of the wires 20a and 20b in peripheral circuit can be led out to the upper wires 28 with a shortest distance. As a result, the nonvolatile semiconductor memory device can be manufactured without increasing the masks and the process steps in number in the manufacturing process.

Figure 7:
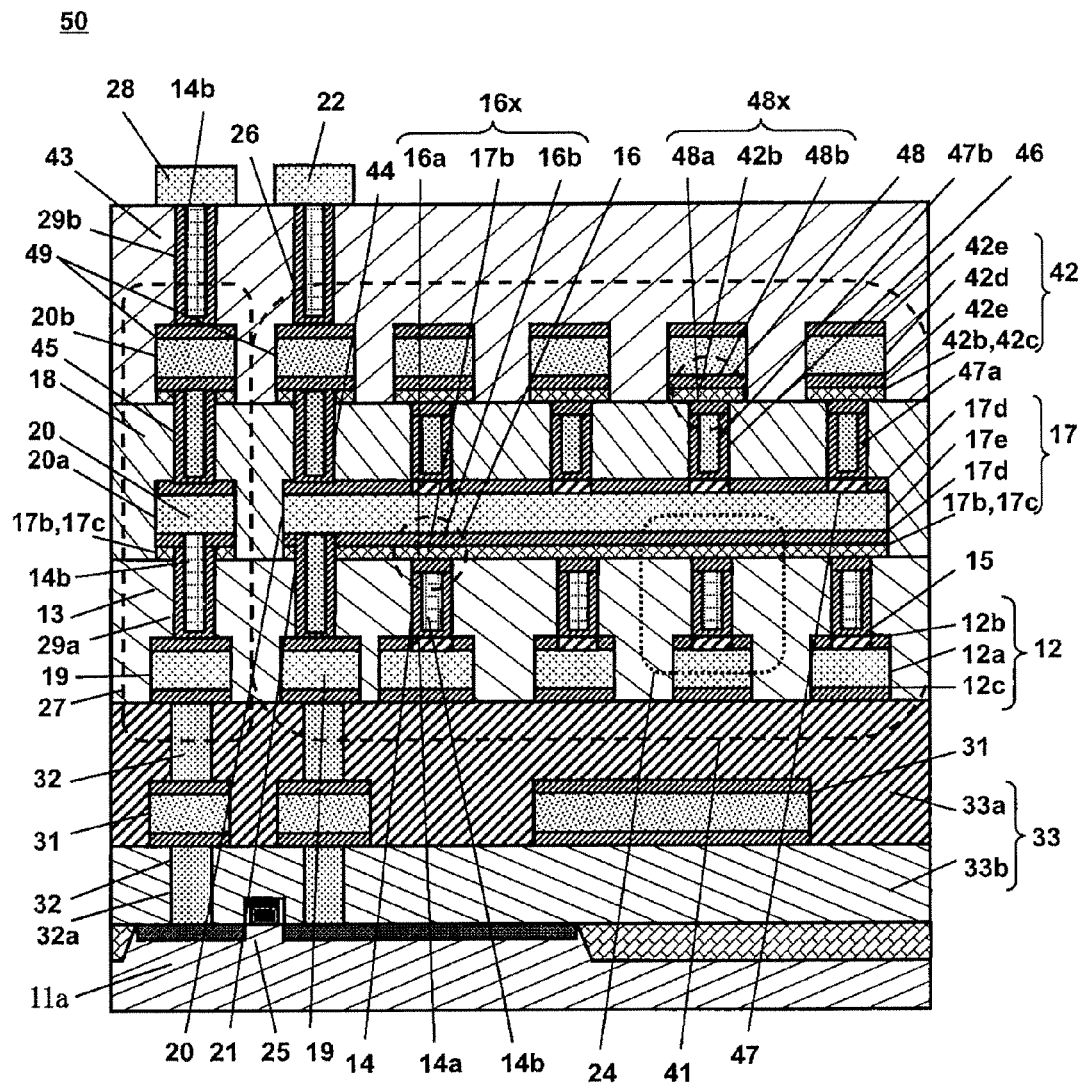
FIG. 7 is a cross-sectional view schematically showing a configuration of another nonvolatile semiconductor memory device according to Embodiment 2 of the present invention.

FIG. 7 is a cross-sectional view schematically showing a configuration of another nonvolatile semiconductor memory device 50 according to Embodiment 2 of the present invention. The nonvolatile semiconductor memory device 50 is different from the nonvolatile semiconductor memory device 40 of FIG. 6 in that drive circuits are provided in a lower layer.

To be specific, in the nonvolatile semiconductor memory device 50 of FIG. 7, each first memory wire 12 in the cross-point memory section 41 is connected to at least any one of transistors 25 underlying the first resistance variable layers 15 and the first memory wires 12.

As shown in FIG. 7, the drive circuit formed on the semiconductor substrate 11a to include the transistors 25, the lower wires 31 within the drive circuits, the first memory wires 12 in the cross-point memory section 41 and the wires 20a and 20b in peripheral circuit adjacent to the cross-point memory section 41 are respectively electrically connected to each other via the lower contacts 32, as desired. As shown in FIG. 7, each lower contact 32 is formed inside the contact hole 32a penetrating the interlayer insulating layer 33 (33a and 33b) disposed in a lower layer.

In the above described configuration, the second memory wires 17 in the cross-point memory section 41 and the wire 20a in peripheral circuit can be formed as the wire layer on the same layer, while the third memory wires 42 in the cross-point memory section 41 and the wires 20b in peripheral circuit can be formed as the wire layer on the same layer. In addition, the wires can be connected to each other via the contacts with a shortest distance. This makes it possible to improve reliability and reduction in a connection resistance, thereby achieving a high-speed memory operation.

In the nonvolatile semiconductor memory devices 40 and 50 shown in FIGS. 6 and 7, respectively, it is supposed that the second interlayer insulating layer 18, the third interlayer insulating layer 43, the third memory wires 42, the second resistance variable layers 47 which are filled into the second memory cell holes 46, and the second non-ohmic elements 48 are one constituent unit of the second memory cell layer. In the nonvolatile semiconductor memory devices 40 and 50 each including one or more constituent units being stacked together, the wire 20a, 20b in peripheral circuit may be formed in a portion at least one of the wire layers, the wires 20a in peripheral circuit may have the semiconductor layer 17b or the insulator layer 17c in a lowermost layer, and the wires 20b in peripheral circuit may have the semiconductor layer 42b or the insulator layer 42c in a lowermost layer, and a contact penetrating the interlayer insulating layer provided between the wires 20a and 20b in different peripheral circuits arranged at upper and lower sides may penetrate the semiconductor layer 17b and 42b or the insulator layer 17c and 42c.

In such a configuration, the cross-point memory section and the peripheral circuits can be three-dimensionally connected to each other with a shortest distance and the wires in the cross-point memory section and in the peripheral circuit can be three-dimensionally connected to each other with a shortest distance. This makes it possible to achieve a nonvolatile semiconductor memory device which does not operate incorrectly and has high reliability and high-dense integration.

Next, the manufacturing method of the nonvolatile semiconductor memory device of this Embodiment will be described with reference to FIGS. 8(a) to 8(c) and FIGS. 9(a) and 9(b) using the nonvolatile semiconductor memory device 40 as an example.

Figure 8:
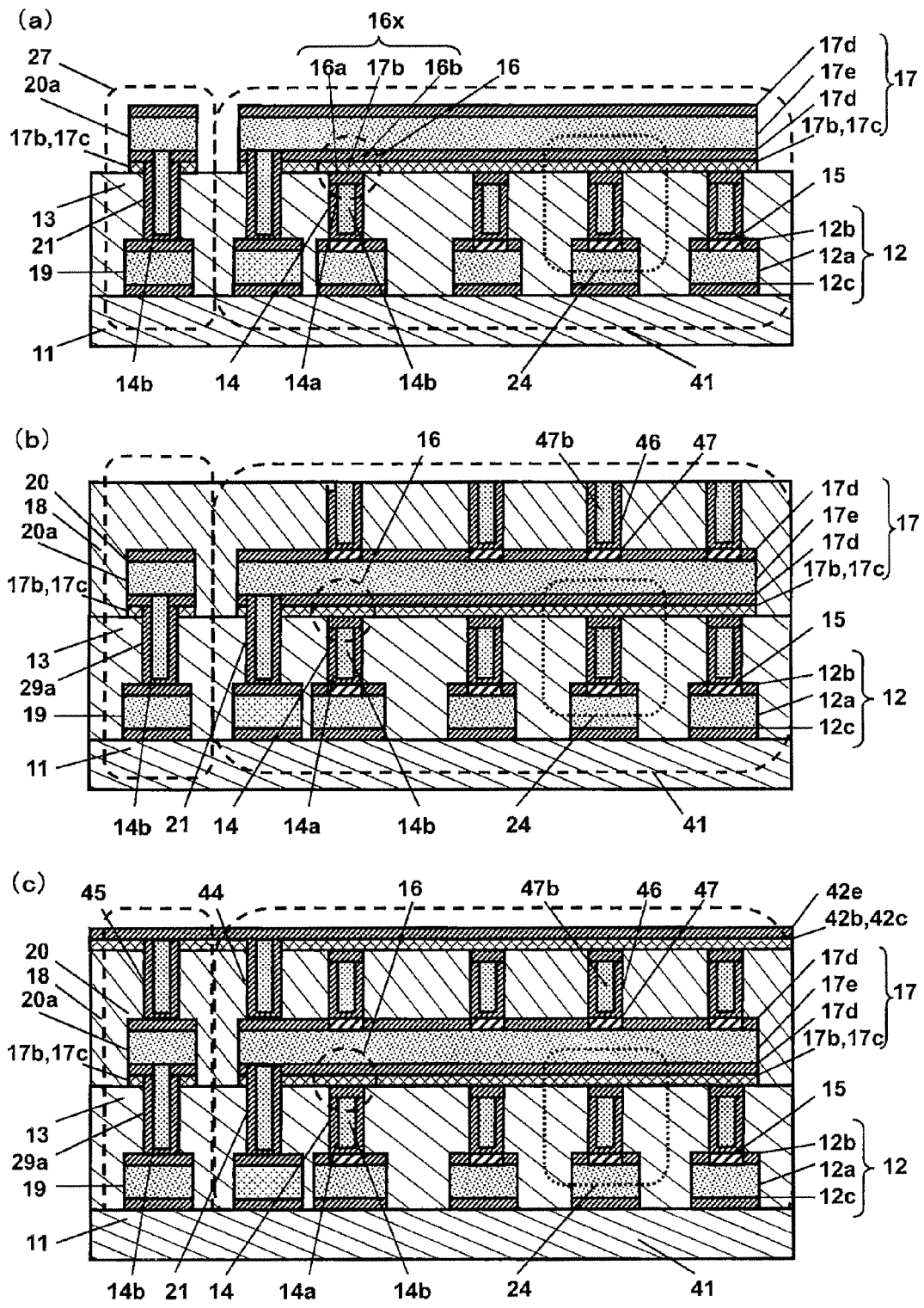
FIGS. 8(a) to 8(c) are schematic cross-sectional views of a process step flow (latter half part), showing a manufacturing method of the nonvolatile semiconductor memory device according to Embodiment 2 of the present invention.
Figure 9:
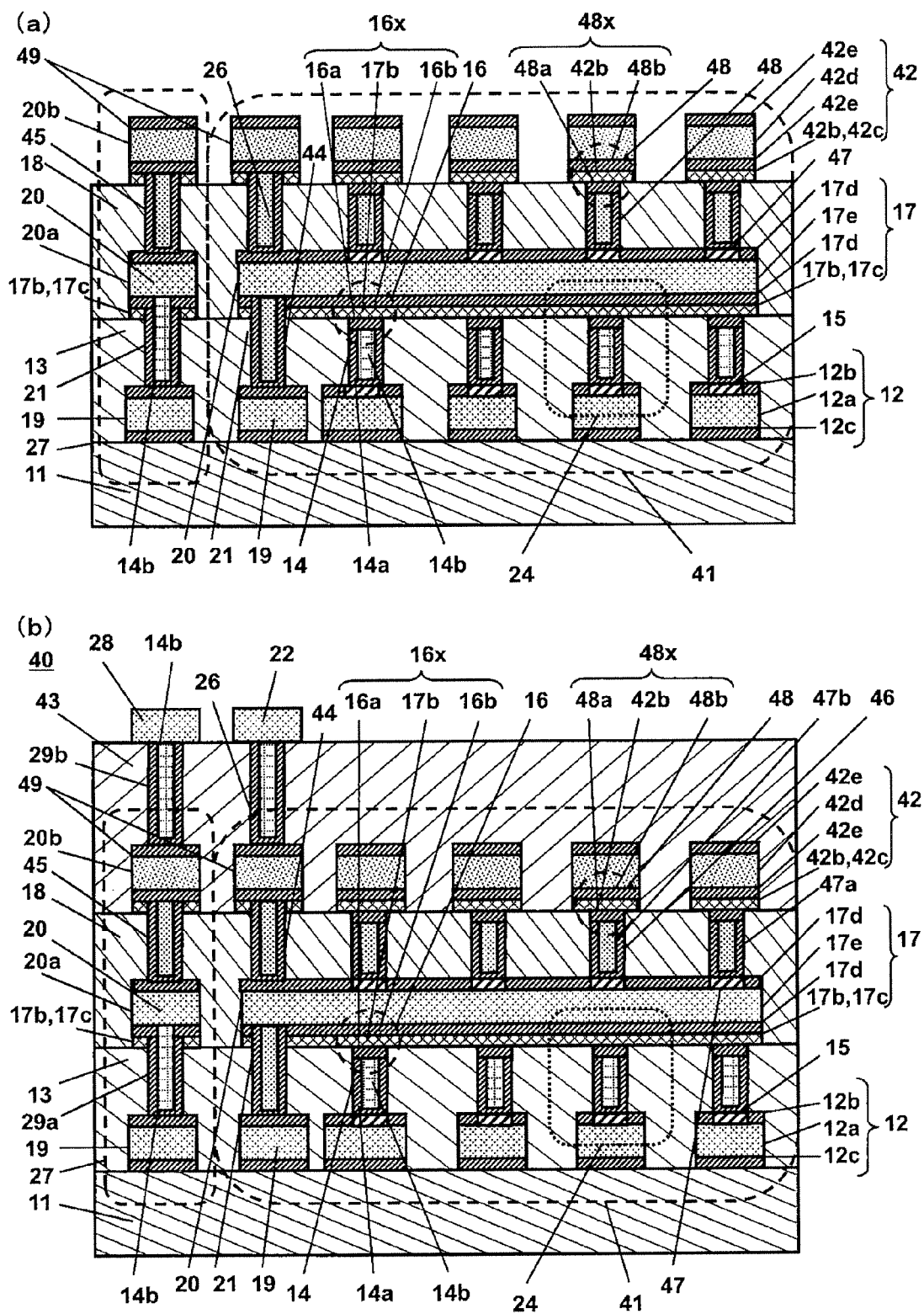
FIG. 9(a) and FIG. 9(b) are schematic cross-sectional views of a process step flow (latter half part), showing a manufacturing method of the nonvolatile semiconductor memory device according to Embodiment 2 of the present invention.

FIGS. 8 and 9 are schematic cross-sectional views of a process step flow showing the manufacturing method of the nonvolatile semiconductor memory device 40 of this Embodiment. Although the process step flow of FIG. 4 and FIGS. 5(a) and 5(b) described in Embodiment 1 is performed before the process step flow of FIG. 8, it will not be described herein repetitively.

The manufacturing method of the nonvolatile semiconductor memory device 40 includes a step for forming the first memory wires 12 of a stripe shape on the substrate 11, a step for forming the first interlayer insulating layer 13 on the substrate 11 provided with the first memory wires 12, a step for forming the first memory cell holes 14 in predetermined positions of the first interlayer insulating layer 13 on the first memory wires 12 and a step for forming the first resistance variable layers 15 inside the first memory cell holes 14, respectively. The manufacturing method of the nonvolatile semiconductor memory device 40 includes a step for filling at least one layer in a stacked structure constituting the first non-ohmic element 16 into the upper portion of each first memory cell hole 14, and a step for forming the semiconductor layer 17b or insulator layer 17c in the stacked structure constituting the first non-ohmic elements 16, on the first interlayer insulating layer 13 such that the semiconductor layer 17b or the insulator layer 17c covers first memory cell holes 14. Furthermore, the manufacturing method of the nonvolatile semiconductor memory device 40 includes a step for forming the first contacts 21 and the third contacts 29a on the first memory wires 12 such that the first contacts 21 and the third contacts 29a penetrate the first interlayer insulating layer 13 and the semiconductor layer 17b or insulator layer 17c in the stacked structure, a step for forming the second memory wires 17 each including other layer in the stacked structure constituting the first non-ohmic element 16 on the first interlayer insulating layer 13 and the semiconductor layer 17b or insulator layer 17c in the stacked structure such that the second memory wires 17 cover at least a portion of the first contacts 21 and a portion of the third contacts 29a, a step for forming the second interlayer insulating layer 18 over the entire surface, a step for forming the second memory cell holes 46 in predetermined positions on the second memory wires 17 such that the second memory cell holes 46 penetrate the second interlayer insulating layer 18, and a step for forming the second resistance variable layers 47 into the second memory cell holes 46, respectively. In addition, the manufacturing method of the nonvolatile semiconductor memory device 40 includes a step for filling at least one layer in the stacked structure constituting the second non-ohmic element 48 into the upper portion of each second memory cell hole 46, a step for forming the semiconductor layer 42b or insulator layers 42c in the stacked structure constituting the second non-ohmic element 48, on the second interlayer insulating layer 18, such that the semiconductor layer 42b or the insulator layer 42c covers the second memory cell holes 46, a step for forming the fifth contacts 44 and the sixth contacts 45 on the second memory wires 17 such that each of the fifth contacts 44 and each of the sixth contacts 45 penetrate the second interlayer insulating layer 18 and the semiconductor layer 42b or the insulator layer 42c in the stacked structure, and a step for forming the third memory wires 42 each including other layer in the stacked structure constituting the second non-ohmic elements 48, on the second interlayer insulating layer 18 and the semiconductor layers 42b or insulator layers 42c in the stacked structure such that the third memory wires 42 cover at least a portion of the fifth contacts 55 and at least a portion of the sixth contacts 45.

Next, a difference between the manufacturing method of the nonvolatile semiconductor memory device 40 of this Embodiment and that in Embodiment 1 will be described specifically with reference to FIGS. 8 and 9 sequentially.

FIG. 8(a) shows an initial stage for manufacturing a second-layer cross-point memory, on a first-layer cross-point memory. As shown in FIG. 8(b), the second interlayer insulating layer 18 is formed over the second memory wires 17 and the first interlayer insulating layer 13, and the second memory cell holes 46 are formed in positions corresponding to the second cross-point memories such that the second memory cell holes 46 penetrate the second interlayer insulating layer 18. The second memory cell holes 46 are desirably right above the first memory cell holes 14, respectively, to miniaturize a cell layout, and to maintain a symmetric property between upper and lower cells in the cross-point memory to thereby suppress a variation in a circuit operation.

Then, as in Embodiment 1, a portion of the barrier layer 17d at the lower portion of each second memory cell hole 46 is subjected to oxygen aching or oxygen ion implantation, to form the second resistance variable layer 47, and the conductive layer 47b is formed thereon to fill the second memory cell hole 46. By performing an etch-back process, a portion of the conductive layer 47b in the upper portion of each second memory cell hole 46 is removed and the conductive layer is filled thereinto to form the lower electrode 48a of the MSM diode 48x.

As shown in FIG. 8(c), the semiconductor layer 42b is formed over the second memory cell holes 46 and the entire upper surface of the second interlayer insulating layer 18, and the fifth contacts 44 and the sixth contacts 45 are formed to penetrate the second interlayer insulating layer 18 and the semiconductor layer 42b.

Then, as shown in FIG. 9(a), the third memory wires 42 of a stripe shape are formed in the cross-point memory section 41 to cross the second memory wires 17 perpendicularly to the second memory wires 17, respectively, in the cross-point memory section 41, and the third wire layer 49 are formed on the fifth contacts 44 and the sixth contacts 45. Each of the third memory wires 42 formed on the second memory cell holes 46 is composed of the semiconductor layer 42b, the barrier layers 42e and the low-resistance conductive layer 42d. Each MSM diode 48x is composed of the lower electrode 48a formed within the upper portion of each of the second memory cell holes 46, the semiconductor layer 42b and the upper electrode 48b.

Through the above described process step flow, the nonvolatile semiconductor memory device 40 of this Embodiment shown in FIG. 9(b) can be manufactured.

In such a method, the first memory wires 12 are connected to the second memory wires 17 and the second memory wires 17 are connected to the third wires 42 via the first to sixth contacts 21, 26, 29a, 29b, 44 and 45 with shortest distances. In addition, the wires in the cross-point memory section 41 and the wire 20a in peripheral circuit are formed concurrently as the wire layer on the same plate plane, while the wires in the cross-point memory section 41 and the wires 20a and 20b in peripheral circuit are formed concurrently as the wire layer on the same plate plane, respectively. In the configuration of the memory cell 24 having a combination of the non-ohmic element such as the diode element and the resistance variable layer, since the size of the diode element can be made larger than the size of the resistance variable layer, for example, the diode element can have a current supply capability to flow a sufficient current through the resistance variable layer. In addition, the cross-point memory section and the peripheral circuit can be three-dimensionally connected to each other with a shortest distance and the wires in the cross-point memory section and in peripheral circuits can be three-dimensionally connected to each other with a shortest distance. This makes it possible to achieve a nonvolatile semiconductor memory device which does not operate incorrectly and has high reliability and high-dense integration. In addition, since a standard Si semiconductor process step adapted for miniaturization can be used, the number of masks and the process cost can be reduced, and the process step can be simplified.

Embodiment 3

Figure 10:
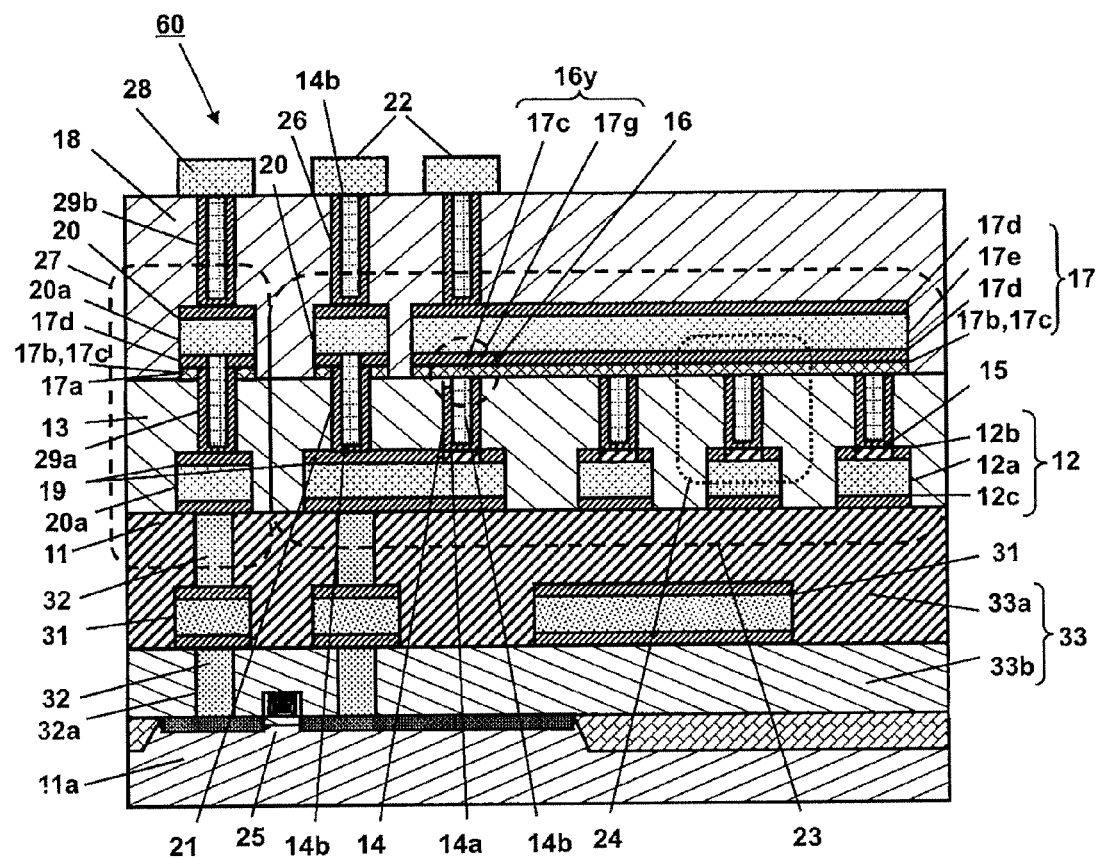
FIG. 10 is a cross-sectional view of a nonvolatile semiconductor memory device according to Embodiment 3 of the present invention.

FIG. 10 is a cross-sectional view of a nonvolatile semiconductor memory device 60 according to Embodiment 3 of the present invention. A difference between this Embodiment and Embodiment 1 is that the first non-ohmic element 16 is a Schottky diode 16y in Embodiment 3. To be specific, as shown in FIG. 10, the first non-ohmic element 16 is the Schottky diode 16y having a two-layer stacked structure consisting of the semiconductor layer 17c and a metal electrode layer 17g, and the metal electrode layer 17g which is closer to the first resistance variable layer 15 is filled into each first memory cell hole 14.

In the case of the configuration of the Schottky diode 16y, since majority carriers are dominant in the diode, a current supply capability of the diode can be increased and a high-speed operation can be achieved. This configuration is suitable for so-called a unipolar resistance variable layer which changes a retained resistance value in response to voltages with the same polarity and different magnitudes.

Figure 11:
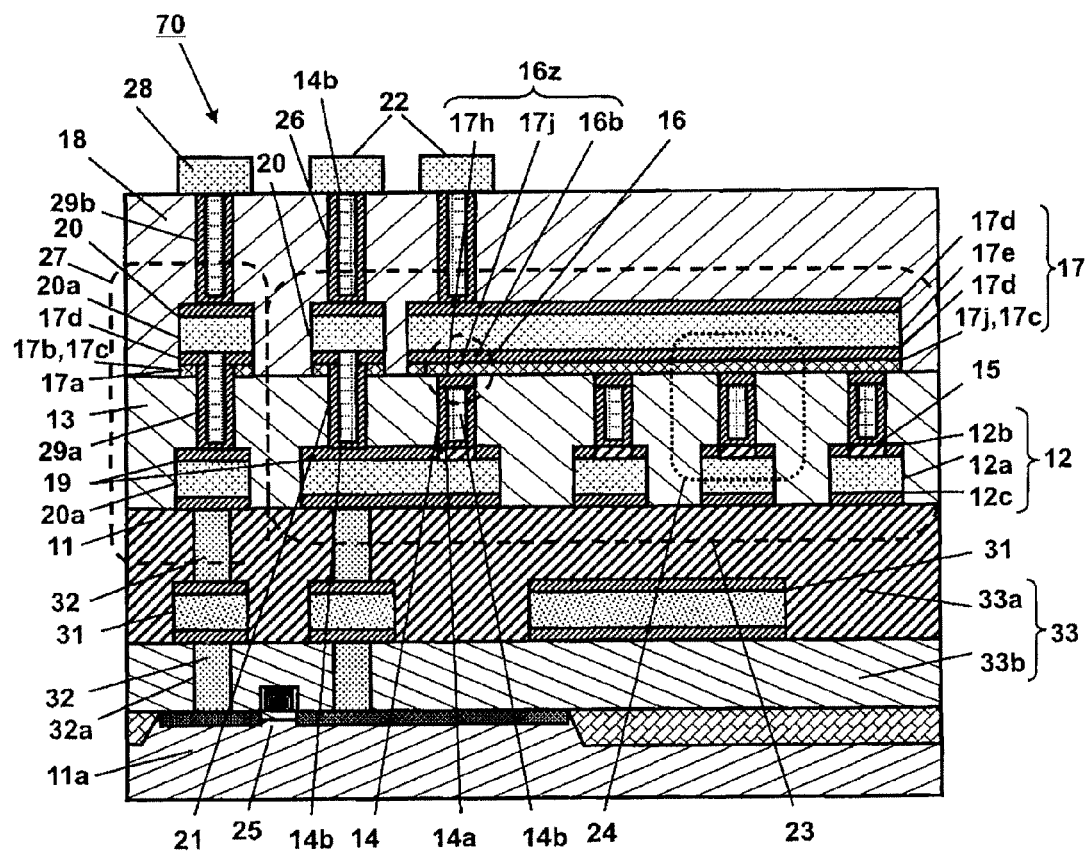
FIG. 11 is a cross-sectional view of another nonvolatile semiconductor memory device according to Embodiment 3 of the present invention.

FIG. 11 is a cross-sectional view of another nonvolatile semiconductor memory device 70 according to Embodiment 3 of the present invention. A difference between this Embodiment and Embodiment 1 is that the first non-ohmic element 16 is a pn-junction diode 16z. To be specific, as shown in FIG. 11, the first non-ohmic element 16 is the pn-junction diode having a two-layer stacked structure consisting of a p-type semiconductor layer 17h and a n-type semiconductor layer 17j. Either the p-type semiconductor layer 17h or the n-type semiconductor layer 17j is filled into each first memory cell hole 14. In this example, the p-type semiconductor layer 17h is filled into each first memory cell hole 14. The positions of the p-type semiconductor layer 17h and the n-type semiconductor layer 17j may be reversed.

Although the current supply capability of the pn-junction diode is smaller than that of the MSM diode because minority carriers are dominant in the pn-junction diode, it is expected that an excess current is prevented and electric power consumption is effectively reduced in the pn-junction diode. This configuration is suitable for so-called a unipolar resistance variable layer which changes a retained resistance value in response to voltages with the same polarity and different magnitudes.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

The present invention relates to a cross-point nonvolatile semiconductor memory device using diode elements and resistance variable layers, and achieves a nonvolatile memory having a very large memory capacity. Therefore, the present invention is useful in fields of various electronic hardware using nonvolatile memory devices.

The invention claimed is:

1. A nonvolatile semiconductor memory device comprising:
   a substrate;
   first memory wires formed on the substrate to have a stripe shape;
   a first interlayer insulating layer formed over the substrate and the first memory wires;
   first memory cell holes which are formed in the first interlayer insulating layer on the first memory wires;
   first resistance variable layers which are connected to the first memory wires via the first memory cell holes, respectively;
   first non-ohmic elements formed on the first resistance variable layers, respectively;
   second memory wires of a stripe shape which are formed on the first interlayer insulating layer such that the second memory wires cross the first memory wires perpendicularly to the first memory wires, respectively; and
   a second interlayer insulating layer formed over the second memory wires and the first interlayer insulating layer;
   wherein each of the second memory wires includes a plurality of layers including at least a portion of each of the first non-ohmic elements and has a conductive layer in an uppermost layer of the second memory wire and a semiconductor layer or an insulator layer which is a portion of each of the first non-ohmic elements in a lowermost layer of the second memory wire;
   each of the first memory wires is connected to the uppermost layer of the second memory wire via a first contact penetrating the first interlayer insulating layer, and the first contact penetrates the semiconductor layer or the insulator layer of the second memory wire; and
   each of the first non-ohmic elements has a stacked-layer structure including two or more layers, and a portion of the stacked-layer structure is filled into a corresponding one of the first memory cell holes.

2. The nonvolatile semiconductor memory device according to claim 1, comprising a memory cell section including memory cells which are formed between the first memory wires and the second memory wires and are arranged in matrix, each of the memory cells including the first resistance variable layer and the first non-ohmic element which are electrically connected in series; and a peripheral circuit section adjacent to the memory cell section;
   wherein wires in the peripheral circuit section are formed by first peripheral circuit wires having a structure identical to a structure of the first memory wires in the memory cell section and second peripheral circuit wires having a structure identical to a structure of the second memory wires in the memory cell section;
   wherein the first memory wires and the first peripheral circuit wires are formed by a first wire layer which is a common wire layer, and the second memory wires and the second peripheral circuit wires are formed by a second wire layer which is a common wire layer; and
   wherein the first peripheral circuit wires are connected to uppermost layers of the second peripheral circuit wires via third contacts penetrating the first interlayer insulating layer, respectively, and each of the third contacts penetrates a portion of the semiconductor layer or the insulator layer of the second wire layer.

3. A nonvolatile semiconductor memory device comprising:
   a substrate;
   first memory wires formed on the substrate to have a stripe shape;
   a first interlayer insulating layer formed over the substrate and the first memory wires;
   first memory cell holes which are formed in the first interlayer insulating layer on the first memory wires;
   first resistance variable layers which are connected to the first memory wires via the first memory cell holes, respectively;
   first non-ohmic elements formed on the first resistance variable layers, respectively;
   second memory wires of a stripe shape which are formed on the first interlayer insulating layer such that the second memory wires cross the first memory wires perpendicularly to the first memory wires, respectively;
   a second interlayer insulating layer formed over the second memory wires and the first interlayer insulating layer;
   second memory cell holes penetrating the second interlayer insulating layer on the second memory wires;

second resistance variable layers which are connected to the second memory wires via the second memory cell holes, respectively;

second non-ohmic elements formed on the second resistance variable layers, respectively; and third memory wires of a stripe shape which are formed on the second interlayer insulating layer such that the third memory wires cross the second memory wires perpendicularly to the second memory wires, respectively;

wherein each of the second memory wires includes a plurality of layers including at least a portion of each of the first non-ohmic elements and has a conductive layer in an uppermost layer of the second memory wire and a semiconductor layer or an insulator layer which is a portion of each of the first non-ohmic elements in a lowermost layer of the second memory wire;

each of the third memory wires includes a plurality of layers including at least a portion of each of the second non-ohmic elements and has a conductive layer in an uppermost layer of the third memory wire and a semiconductor layer or an insulator layer which is a portion of each of the second non-ohmic elements in a lowermost layer of the third memory wire;

the first memory wires are connected to uppermost layers of second memory wires, via first contacts penetrating the first interlayer insulating layer, respectively;

uppermost layers of the second memory wires are connected to uppermost layers of third memory wires via fifth contacts penetrating the second interlayer insulating layer, respectively;

each of the first contacts penetrates a portion of the semiconductor layer or the insulator layer of the second memory wire;

each of the fifth contacts penetrates a portion of the semiconductor layer or the insulator layer of the third memory wire; and each of the first non-ohmic elements has a stacked-layer structure including two or more layers, each of the second non-ohmic elements has a stacked-layer structure including two or more layers, a portion of the stacked-layer structure of each of the first non-ohmic elements is filled into a corresponding one of the first memory cell holes, and a portion of the stacked-layer structure of each of the second non-ohmic elements is filled into a corresponding one of the second memory cell holes.

4. The nonvolatile semiconductor memory device according to claim 3, comprising a memory cell section including memory cells which are formed between the first memory wires and the second memory wires, and between the second memory wires and the third memory wires, and are arranged in matrix, each of the memory cells including the first resistance variable layer and the non-ohmic element, or the second resistance variable layer and the non-ohmic element which are electrically connected in series; and a peripheral circuit section adjacent to the memory cell section;

wherein wires in the peripheral circuit section are formed by first peripheral circuit wires having a structure identical to a structure of the first memory wires in the memory cell section, second peripheral circuit wires having a structure identical to a structure of the second memory wires in the memory cell section, and third peripheral circuit wires having a structure identical to a structure of the third memory wires in the memory cell section;

wherein the first memory wires and the first peripheral circuit wires are formed by a first wire layer which is a common wire layer; the second memory wires and the second peripheral circuit wires are formed by a second wire layer which is a common wire layer;

and the third memory wires and the third peripheral circuit wires are formed by a third wire layer which is a common wire layer;

wherein uppermost layers of the first peripheral circuit wires are connected to uppermost layers of the second peripheral circuit wires via third contacts penetrating the first interlayer insulating layer, respectively, wherein uppermost layers of the second peripheral circuit wires are connected to uppermost layers of the third peripheral circuit wires via sixth contacts penetrating the second interlayer insulating layer, respectively; and wherein each of the third contacts penetrates a portion of a semiconductor layer or an insulator layer of the second wire layer and each of the sixth contacts penetrates a portion of a semiconductor layer or an insulator layer of the third wire layer.

5. The nonvolatile semiconductor memory device according to claim 4, further comprising one or more constituent units being stacked together, each of the constituent units including the second interlayer insulating layer, the third interlayer insulating layer, the third wire layer, and the second resistance variable layers and second non-ohmic elements which are filled into the second memory cell holes, respectively;

wherein wires in a peripheral circuit are formed in a portion of at least one of the wire layers;

wherein each of the wires in the peripheral circuit has a semiconductor layer or an insulator layer in a lowermost layer thereof; and wherein a contact penetrating an interlayer insulating layer provided between wires in different peripheral circuits arranged at upper and lower sides and electrically connecting the wires in the peripheral circuits penetrate a portion of the semiconductor layer or the insulator layer.

6. The nonvolatile semiconductor memory device according to claim 1, wherein each of the first memory wires is connected to at least one of transistors located in a layer underlying the first resistance variable layers and the first memory wires.

7. The nonvolatile semiconductor memory device according to claim 4, wherein diode electrodes which are electrodes of the first non-ohmic elements in the second wire layer or electrodes of the second non-ohmic elements in the third wire layer are made of a material of contacting layers of the first contacts, the third contacts, the fifth contacts and the sixth contacts which are arranged adjacent to the first interlayer insulating layer or the second interlayer insulating layer.

8. The nonvolatile semiconductor memory device according to claim 1, wherein each of the non-ohmic elements is a MSM diode having a stacked structure of three layers which are a semiconductor layer and metal electrode layers provided on and under the semiconductor layer; and wherein the metal electrode layer closer to the resistance variable layer is filled into each of the memory cell holes.

9. The nonvolatile semiconductor memory device according to claim 1, each of the non-ohmic elements is a Schottky diode having a stacked structure of two layers which are a semiconductor layer and a metal electrode layer; and wherein the metal electrode layer is filled into each of the memory cell holes.

10. The nonvolatile semiconductor memory device according to claim 1,
- each of the non-ohmic elements is a pn-junction diode having a stacked structure of two layers which are a p-type semiconductor layer and a n-type semiconductor layer; and
- wherein the p-type semiconductor layer or the n-type semiconductor layer is filled into each of the memory cell holes.

11. A method of manufacturing a nonvolatile semiconductor memory device, comprising the steps of:
- forming first memory wires of a stripe shape on a substrate;
- forming a first interlayer insulating layer over the substrate provided with the first memory wires;
- forming first memory cell holes in predetermined positions of the first interlayer insulating layer on the first memory wires, respectively;
- filling first resistance variable layers into the first memory cell holes, respectively;
- filling at least one layer of a stacked structure constituting each of first non-ohmic elements into an upper portion of the first memory cell hole;
- forming a semiconductor layer or an insulator layer which is portions of the first non-ohmic elements over the first interlayer insulating layer such that the semiconductor layer or the insulator layer covers the first memory cell holes;
- removing portions of the first interlayer insulating layer and portions of the semiconductor layer or the insulator layer to form first contacts on the first memory wires; and
- patterning semiconductor layers or insulator layers which are portions of the first non-ohmic elements to form a conductive layer over the first insulating layer such that the conductive layer covers at least portions of the first contacts, to form second memory wires each having the conductive layer in an uppermost layer thereof and the semiconductor layer or the insulator layer which is portions of the first non-ohmic elements in a lowermost layer thereof.

12. A method of manufacturing a nonvolatile semiconductor memory device, comprising the steps of:
- forming first memory wires of a stripe shape on a substrate;
- forming a first interlayer insulating layer over the substrate provided with the first memory wires;
- forming first memory cell holes in predetermined positions of the first interlayer insulating layer on the first memory wires, respectively;
- filling first resistance variable layers into the first memory cell holes, respectively;
- filling at least one layer of a stacked structure constituting each of first non-ohmic elements into an upper portion of the first memory cell hole;
- forming a semiconductor layer or an insulator layer which is portions of the first non-ohmic elements over the first interlayer insulating layer such that the semiconductor layer or the insulator layer covers the first memory cell holes;
- removing portions of the first interlayer insulating layer and portions of the semiconductor layer or the insulator layer to form first contacts on the first memory wires;
- patterning semiconductor layers or insulator layers which are portions of the first non-ohmic elements to form a conductive layer over the first insulating layer such that the conductive layer covers at least portions of the first contacts, to form second memory wires each having the conductive layer in an uppermost layer thereof and the semiconductor layer or the insulator layer which is portions of the first non-ohmic elements in a lowermost layer thereof;
- forming a second interlayer insulating layer over the first interlayer insulating layer such that the second interlayer insulating layer covers the second memory wires;
- forming second memory holes on the second memory wires such that the second memory cell holes penetrate the second interlayer insulating layer;
- filling second resistance variable layers into the second memory cell holes, respectively;
- filling at least one layer of a stacked structure constituting each of second non-ohmic elements into an upper portion of the second memory cell hole;
- forming a semiconductor layer or an insulator layer which is portions of the second non-ohmic elements over the second interlayer insulating layer such that the semiconductor layer or the insulator layer covers the second contact holes;
- removing portions of the second interlayer insulating layer and the semiconductor layer or the insulator layer to form fifth contacts on the second memory wires; and
- patterning semiconductor layers or insulator layers which are portions of the second non-ohmic elements to form a conductive layer over the second insulating layer such that the conductive layer covers at least portions of the fifth contacts, to form third memory wires each having the conductive layer in an uppermost layer thereof and the semiconductor layer or the insulator layer which is a portion of each of the second non-ohmic elements in a lowermost layer thereof.

* * * * *